(12) United States Patent
No

(10) Patent No.: US 12,456,424 B2
(45) Date of Patent: Oct. 28, 2025

(54) DISPLAY DEVICE

(71) Applicant: Samsung Display Co., LTD., Yongin-si (KR)

(72) Inventor: Sang Yong No, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/438,236

(22) Filed: Feb. 9, 2024

(65) Prior Publication Data

US 2024/0412685 A1   Dec. 12, 2024

(30) Foreign Application Priority Data

Jun. 9, 2023   (KR) .................... 10-2023-0074029

(51) Int. Cl.
| | |
|---|---|
| G09G 3/3233 | (2016.01) |
| G09G 3/3275 | (2016.01) |
| H10K 59/131 | (2023.01) |
| H10K 59/88 | (2023.01) |

(52) U.S. Cl.
CPC ......... G09G 3/3233 (2013.01); G09G 3/3275 (2013.01); H10K 59/131 (2023.02); H10K 59/88 (2023.02); *G09G 2300/0426* (2013.01)

(58) Field of Classification Search
CPC .... H10K 59/131; H10K 59/88; G09G 3/3275; G09G 3/3233; G09G 3/3283; G09G 3/3291; G09G 2300/0426
See application file for complete search history.

(56) References Cited

U.S. PATENT DOCUMENTS

| | | | | |
|---|---|---|---|---|
| 12,020,616 | B2* | 6/2024 | Dong | H10K 59/126 |
| 12,136,392 | B2* | 11/2024 | Choi | G09G 3/3233 |
| 2012/0182277 | A1 | 7/2012 | Jeong et al. | |
| 2019/0278145 | A1* | 9/2019 | Tanaka | G02F 1/136286 |
| 2021/0375215 | A1* | 12/2021 | Cho | G09G 3/3291 |
| 2022/0005886 | A1 | 1/2022 | Jeong et al. | |

(Continued)

FOREIGN PATENT DOCUMENTS

| | | |
|---|---|---|
| KR | 10-1117725 B1 | 3/2012 |
| KR | 10-1627245 B1 | 6/2016 |

(Continued)

*Primary Examiner* — Xuemei Zheng

(74) *Attorney, Agent, or Firm* — Womble Bond Dickinson (US) LLP

(57) ABSTRACT

A display device includes: a substrate including a display area including emission areas, and a non-display area; a circuit layer on the substrate; and an element layer on the circuit layer, and including light emitting elements corresponding to the emission areas. The circuit layer includes: light emitting pixel drivers electrically connected to the light emitting elements; data lines to transmit data signals; first dummy lines extending in a first direction crossing the data lines; and second dummy lines extending parallel to the data lines, and paired with the data lines, respectively. Each of the data lines and the second dummy lines include an extension portion extending in a second direction crossing the first direction, one data line further includes first protrusions crossing some of the first dummy lines, and one second dummy line paired with the one data line further includes second protrusions crossing others of the first dummy lines.

20 Claims, 23 Drawing Sheets

(56) References Cited

U.S. PATENT DOCUMENTS

2022/0285460 A1* 9/2022 Kim ................. H10K 59/60
2023/0140561 A1   5/2023 Lee et al.

FOREIGN PATENT DOCUMENTS

| KR | 10-2021-0105462 A | 8/2021 |
| KR | 10-2021-0155444 A | 12/2021 |
| KR | 10-2022-0138917 A | 10/2022 |

* cited by examiner

FIG. 1
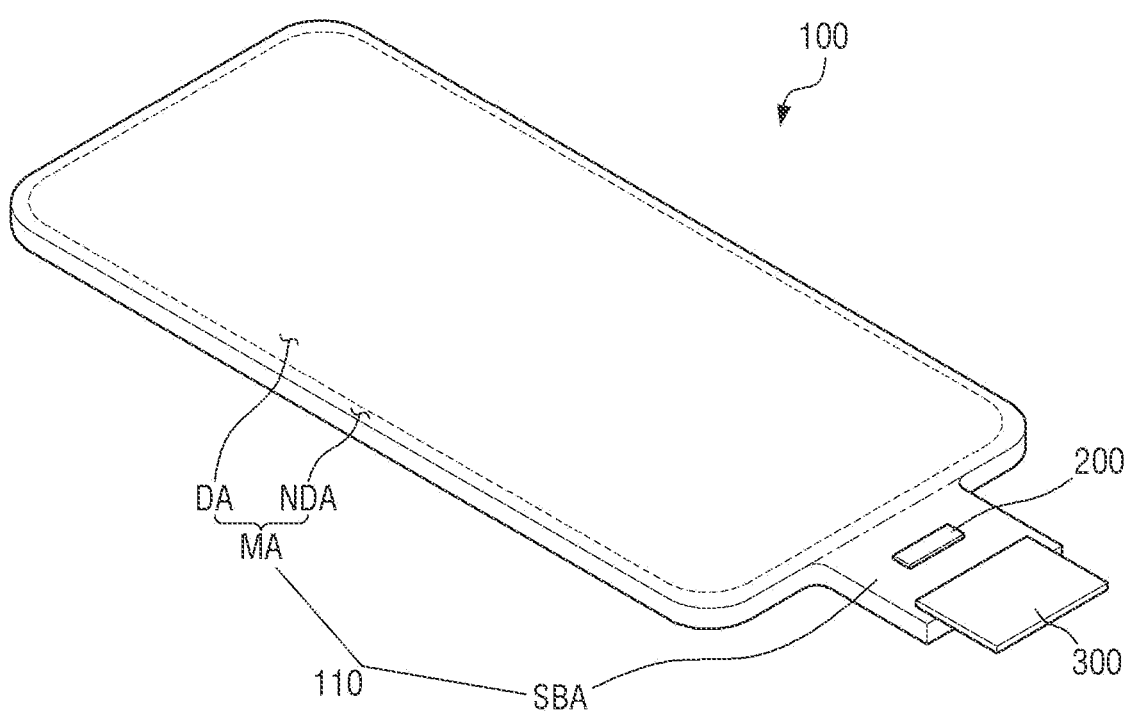
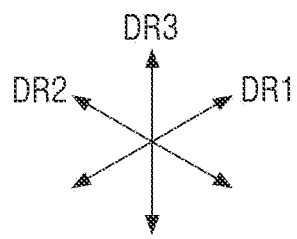

DISPLAY DEVICE

CROSS-REFERENCE TO RELATED APPLICATION

The present application claims priority to and the benefit of Korean Patent Application No. 10-2023-0074029, filed on Jun. 9, 2023, in the Korean Intellectual Property Office, the entire disclosure of which is incorporated by reference herein.

BACKGROUND

1. Field

Aspects of embodiments of the present disclosure relate to a display device.

2. Description of the Related Art

With the advancement of information-oriented society, more and more demand is placed on display devices for displaying images in various ways. For example, display devices are employed in various electronic devices, such as smartphones, digital cameras, laptop computers, navigation devices, and smart televisions.

The display device may be a flat panel display device, such as a liquid crystal display device, a field emission display device, and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements. Each of the light emitting elements may include a light emitting layer made of an organic light emitting material. The organic light emitting display device implements an image display using a self-light emitting element, and thus, may have relatively superior performance in power consumption, response speeds, luminous efficiency, luminance, and wide viewing angles compared to those of other display devices.

One surface of the display device may include a display area in which an image is displayed, and a non-display area that is a periphery of the display area. Emission areas for emitting light with respective luminances and colors may be arranged in the display area.

The above information disclosed in this Background section is for enhancement of understanding of the background of the present disclosure, and therefore, it may contain information that does not constitute prior art.

SUMMARY

A display device may include data supply lines disposed in a non-display area, and electrically connecting data lines to a display driving circuit.

In order to reduce the width of the non-display area due to the arrangement of the data supply lines, the display device may further include transmission bypass lines disposed in the display area. The transmission bypass lines may electrically connect some of the data supply lines to some of the data lines.

Further, in order to prevent or substantially prevent the presence or absence of the transmission bypass lines from being visually recognized as the transmission bypass lines are disposed in a part (e.g., in only a part) of the display area, the transmission bypass lines may be provided as a part of dummy lines disposed throughout the display area.

In addition, because connection holes for electrical connection between some of the data lines and the transmission bypass lines may be formed with a relatively large width as they penetrate a via layer, each of the data lines and the dummy lines extending parallel to or substantially parallel to the data lines may include protrusions protruding from an extension portion and overlapping with the connection holes.

When the protrusions are disposed at (e.g., only at) points where the connection holes are disposed, the presence or absence of the protrusions may be visually recognized, so the protrusions may be arranged symmetrically or substantially symmetrically regardless of the points where the connection holes are disposed.

However, because the protrusions each may have a relatively large width, there may be a limit to increasing the number of light emitting pixel drivers that can be disposed on a substrate due to the arrangement of the protrusions, which may make it more difficult to implement a high resolution.

One or more embodiments of the present disclosure are directed to a display device that may implement a high resolution by reducing the number of protrusions without significantly increasing the visibility of the protrusions.

According to one or more embodiments of the present disclosure, a display device includes: a substrate including a display area including emission areas, and a non-display area around the display area; a circuit layer on the substrate; and an element layer on the circuit layer, and including light emitting elements corresponding to the emission areas, respectively. The circuit layer includes: light emitting pixel drivers electrically connected to the light emitting elements, respectively, and located side by side with one another; data lines configured to transmit data signals to the light emitting pixel drivers; first dummy lines extending in a first direction crossing the data lines; and second dummy lines extending parallel to the data lines, and paired with the data lines, respectively. Each of the data lines and the second dummy lines include an extension portion extending in a second direction crossing the first direction, one data line from among the data lines further includes first protrusions crossing some of the first dummy lines, and one second dummy line paired with the one data line from among the second dummy lines further includes second protrusions crossing others of the first dummy lines.

In an embodiment, the light emitting pixel drivers may include: a first light emitting pixel driver and a second light emitting pixel driver adjacent to each other in the second direction, and overlapping with the one data line; and a third light emitting pixel driver adjacent to the first light emitting pixel driver in the first direction. The first light emitting pixel driver may overlap with one first protrusion from among the first protrusions, and the second light emitting pixel driver may overlap with one second protrusion from among the second protrusions. Another data line overlapping with the third light emitting pixel driver from among the data lines may further include third protrusions located side by side with the second protrusions, respectively, and another second dummy line paired with the another data line from among the second dummy lines may further include fourth protrusions located side by side with the first protrusions, respectively.

In an embodiment, the display device may further include a display driving circuit configured to output the data signals to the data lines, and the circuit layer may further include data supply lines in the non-display area, and electrically connected to the display driving circuit. A bypass area on one side of the display area may include: a bypass middle area; a first bypass side area parallel to the bypass middle area in the first direction, and in contact with the non-display area; and a second bypass side area between the bypass middle area and the first bypass side area. The data lines may include a first data line in the first bypass side area, and a second data line in the second bypass side area. The first dummy lines may include a first transmission bypass line electrically connected to the first data line, and the second dummy lines may include a second transmission bypass line paired with the second data line, and electrically connected to the first transmission bypass line. From among the data supply lines, a first data supply line configured to transmit a data signal to the first data line from among the data signals may be electrically connected to the first data line through the first transmission bypass line and the second transmission bypass line, and from among the data supply lines, a second data supply line configured to transmit a data signal to the second data line from among the data signals may be directly electrically connected to the second data line.

In an embodiment, the data lines and the second dummy lines may be located on a via layer covering the first dummy lines, the first transmission bypass line may be electrically connected to the second transmission bypass line through a first bypass connection hole, and electrically connected to the first data line through a second bypass connection hole, and the first bypass connection hole and the second bypass connection hole may penetrate the via layer.

In an embodiment, the one second dummy line may be located between the one data line and the another data line, and may be closer to the another data line than the one data line, and the extension portion of the one second dummy line may be adjacent to the extension portion of the another data line.

In an embodiment, the first protrusions may face the extension portion of the one second dummy line, and the second protrusions may face the extension portion of the one data line.

In an embodiment, the one second dummy line and the another second dummy line may be located between the one data line and the another data line, the extension portion of the one second dummy line may be adjacent to the extension portion of the one data line, the extension portion of the another second dummy line may be adjacent to the extension portion of the another data line, the second protrusions of the one second dummy line may face the extension portion of the another second dummy line, and the fourth protrusions of the another second dummy line may face the extension portion of the one second dummy line.

In an embodiment, the first protrusions may protrude in a direction opposite to a direction from the extension portion of the one data line toward the one second dummy line, and the third protrusions may protrude in a direction opposite to a direction from the extension portion of the another data line toward the another second dummy line.

In an embodiment, the one data line and the another data line may be located between the one second dummy line and the another second dummy line, and the extension portion of the one data line may be adjacent to the extension portion of the another data line.

In an embodiment, the first protrusions and the second protrusions may be located between the extension portion of the one data line and the extension portion of the one second dummy line.

In an embodiment, the light emitting pixel drivers may be electrically connected to the data lines through data connection holes, and the data lines may further include connection protrusions overlapping with the data connection holes.

In an embodiment, the second dummy lines may further include dummy protrusions symmetrical to the connection protrusions.

In an embodiment, the connection protrusions may face the extension portions of the second dummy lines.

In an embodiment, the display area may further include a non-emission area as a separation region between the emission areas, and light sensing areas located in parts of the non-emission area. The element layer may further include light sensing elements in the light sensing areas, respectively, and the circuit layer may further include light sensing pixel drivers electrically connected to the light sensing elements, respectively, and read-out lines electrically connected to the light sensing pixel drivers.

In an embodiment, one read-out line from among the read-out lines may be located between the extension portion of the one data line and the extension portion of the another data line.

According to one or more embodiments of the present disclosure, a display device includes: a substrate including a display area including emission areas, and a non-display area around the display area; a circuit layer on the substrate; and an element layer on the circuit layer, and including light emitting elements corresponding to the emission areas, respectively. The circuit layer includes: light emitting pixel drivers electrically connected to the light emitting elements, respectively, and located side by side with one another; data lines configured to transmit data signals to the light emitting pixel drivers; first dummy lines extending in a first direction crossing the data lines; and second dummy lines extending parallel to the data lines, and paired with the data lines, respectively. Each of the data lines and the second dummy lines includes an extension portion extending in a second direction crossing the first direction, and the light emitting pixel drivers includes a first light emitting pixel driver and a second light emitting pixel driver adjacent to each other in the second direction, and overlapping with one data line from among the data lines. The one data line overlapping with the first light emitting pixel driver and the second light emitting pixel driver further includes first protrusions crossing some of the first dummy lines, and one second dummy line paired with the one data line from among the second dummy lines further includes second protrusions crossing others of the first dummy lines. The first light emitting pixel driver overlaps with one first protrusion from among the first protrusions, the second light emitting pixel driver overlaps with one second protrusion from among the second protrusions, and the first protrusions and the second protrusions are located between the extension portion of the one data line and the extension portion of the one second dummy line.

In an embodiment, the light emitting pixel drivers may further include a third light emitting pixel driver adjacent to the first light emitting pixel driver in the first direction, another data line overlapping with the third light emitting pixel driver from among the data lines may further include third protrusions located side by side with the second protrusions, respectively, and another second dummy line paired with the another data line from among the second dummy lines may further include fourth protrusions located side by side with the first protrusions, respectively.

In an embodiment, the display device may further include a display driving circuit configured to output the data signals to the data lines, and the circuit layer may further include data supply lines in the non-display area, and electrically connected to the display driving circuit. A bypass area on one side of the display area may include: a bypass middle area; a first bypass side area parallel to the bypass middle area in the first direction, and in contact with the non-display area; and a second bypass side area between the bypass middle area and the first bypass side area. The data lines may include a first data line in the first bypass side area, and a second data line in the second bypass side area. The first dummy lines may include a first transmission bypass line electrically connected to the first data line, and the second dummy lines may include a second transmission bypass line paired with the second data line, and electrically connected to the first transmission bypass line. From among the data supply lines, a first data supply line configured to transmit a data signal to the first data line from among the data signals may be electrically connected to the first data line through the first transmission bypass line and the second transmission bypass line, and from among the data supply lines, a second data supply line configured to transmit a data signal to the second data line from among the data signals may be directly electrically connected to the second data line.

In an embodiment, the one data line and the another data line may be located between the one second dummy line and the another second dummy line, and the extension portion of the one data line may be adjacent to the extension portion of the another data line.

In an embodiment, the display area may further include a non-emission area as a separation region between the emission areas, and light sensing areas located in parts of the non-emission area. The element layer may further include light sensing elements in the light sensing areas, respectively. The circuit layer may further include light sensing pixel drivers electrically connected to the light sensing elements, respectively, and read-out lines electrically connected to the light sensing pixel drivers. One read-out line from among the read-out lines may be located between the extension portion of the one data line and the extension portion of the another data line.

According to one or more embodiments of the present disclosure, a display device may include a substrate, a circuit layer disposed on the substrate, and an element layer disposed on the circuit layer. The substrate may include a display area in which emission areas are arranged. The element layer may include light emitting elements corresponding to the emission areas, respectively. The circuit layer may include light emitting pixel drivers electrically connected to the light emitting elements, respectively, and arranged side by side with each other, data lines for transmitting data signals to the light emitting pixel drivers, first dummy lines extending in a first direction crossing the data lines, and second dummy lines extending parallel to or substantially parallel to the data lines and paired with the data lines, respectively. Each of the data lines and the second dummy lines may include an extension portion extending in a second direction crossing the first direction. In addition, one of the data lines may include first protrusions crossing some of the first dummy lines. From among the second dummy lines, one second dummy line paired with one data line may include second protrusions crossing the rest of the first dummy lines.

In other words, according to one or more embodiments of the present disclosure, each of one data line and one second dummy line may not include protrusions crossing all of the first dummy lines, one data line may include the first protrusions (e.g., only the first protrusions) crossing some of the first dummy lines, and one second dummy line may include the second protrusions (e.g., only the second protrusions) crossing the rest of the first dummy lines.

According to one or more embodiments of the present disclosure, one data line may include a smaller number of first protrusions than the total number of the first dummy lines, and one second dummy line may include a smaller number of second protrusions than the total number of the first dummy lines. Therefore, the total number of protrusions disposed on the substrate may be reduced, thereby improving a volume ratio of the circuit layer so that a high resolution may be implemented.

According to one or more embodiments of the present disclosure, the light emitting pixel drivers may include a first light emitting pixel driver and a second light emitting pixel driver adjacent to each other in the second direction, and a third light emitting pixel driver adjacent to the first light emitting pixel driver in the first direction. The first light emitting pixel driver and the second light emitting pixel driver may overlap with one data line. The first light emitting pixel driver may overlap with one of the first protrusions of one data line, and the second light emitting pixel driver may overlap with one of the second protrusions of one second dummy line.

According to one or more embodiments of the present disclosure, the first protrusions of one data line and the second protrusions of one second dummy line may alternately overlap with the light emitting pixel drivers arranged in the second direction.

According to one or more embodiments of the present disclosure, the first protrusions and the second protrusions may be repeatedly and alternately arranged in the second direction, so that visibility may not be greatly increased even though they are not mutually symmetrical.

According to one or more embodiments of the present disclosure, connection holes for electrical connection between some of the first dummy lines and some of the data lines, and connection holes for electrical connection between some of the first dummy lines and some of the second dummy lines may be arranged side by side with each other in a diagonal direction crossing the first and second directions. Accordingly, even when the total number of the first protrusions and the second protrusions is reduced, an electrical connection path between the first dummy line, the second dummy line, and the data line may be maintained.

According to one or more embodiments of the present disclosure, the first protrusions and the second protrusions may be disposed between an extension portion of one data line and an extension portion of one second dummy line. Because the first protrusions and the second protrusions may not face each other and may be alternately arranged in a zigzag shape in the second direction, a distance between the extension portion of one data line and the extension portion of one second dummy line may be reduced. As a result, the volume ratio of the circuit layer may be further improved so that a high resolution may be implemented.

However the aspects and features of the present disclosure are not limited to those above, and various other aspects and features may be included in the present disclosure, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 1 is a perspective view illustrating a display device according to an embodiment;

DETAILED DESCRIPTION

Figure 2:
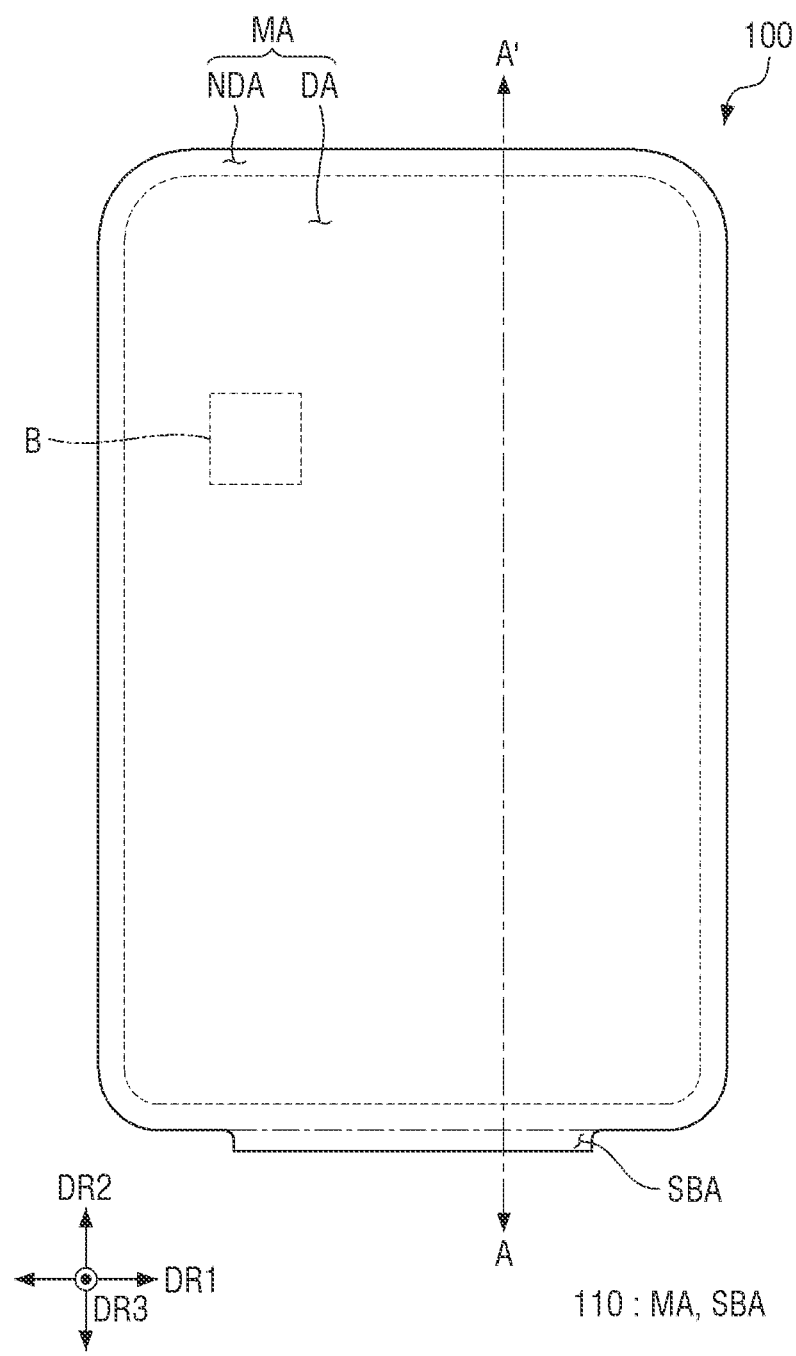
FIG. 2 is a plan view illustrating the display device of FIG. 1.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used herein, the phrase "in a plan view" means when an object portion is viewed from above, and the phrases "in a cross-sectional view" and "in a schematic cross-sectional view" mean when a schematic cross-section taken by vertically cutting an object portion is viewed from the side. The terms "overlap" or "overlapped" mean that a first object may be above or below or to a side of a second object, and/or vice versa. Additionally, the term "overlap" may include layers, stacks, face or facing, extending over, covering, or partly covering or any other suitable terms as would be appreciated and understood by those having ordinary skill in the art. The expression "not overlap" may include meanings such as "spaced apart from", "set aside from", or "offset from", and any other suitable equivalents as would be appreciated and understood by those having ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. For example, the term "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 3:
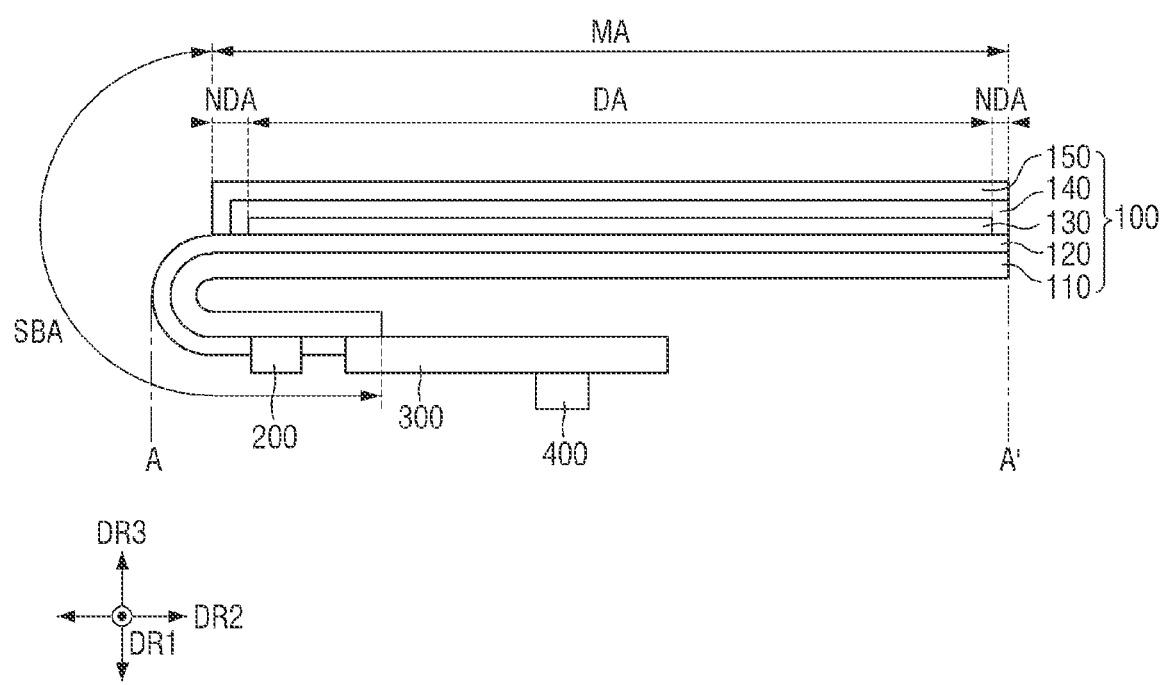
FIG. 3 is a cross-sectional view taken along the line A-A' of FIG. 2.

FIG. 1 is a perspective view illustrating a display device according to an embodiment. FIG. 2 is a plan view illustrating the display device of FIG. 1. FIG. 3 is a cross-sectional view taken along the line A-A' of FIG. 2.

Referring to FIGS. 1 and 2, a display device 100 is a device for displaying a moving image or a still image. The display device 100 may be used as a display screen of various suitable devices, such as a television, a laptop computer, a monitor, a billboard, and an Internet-of-Things (IoT) device, as well as for various suitable portable electronic devices, such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 100 may be a light emitting display device, such as an organic light emitting display including an organic light emitting diode, a quantum dot light emitting display including a quantum dot light emitting layer, an inorganic light emitting display including an inorganic semiconductor, and a micro light emitting display including a micro or nano light emitting diode (LED). Hereinafter, the display device 100 may be described in more detail in the context of an organic light emitting display device as a representative example. However, the present disclosure is not limited thereto, and the display device may be any suitable display device, for example, including an organic insulating material, an organic light emitting material, and a metal material.

The display device 100 may be formed to be flat or substantially flat, but the present disclosure is not limited thereto. For example, the display device 100 may include a curved portion formed at left and right ends, and having a constant curvature or a varying curvature. In addition, the display device 100 may be formed to be flexible so that it can be curved, bent, folded, or rolled.

As illustrated in FIGS. 1, 2, and 3, the display device 100 includes a substrate 110.

The substrate 110 may include a main region MA corresponding to a display surface of the display device 100, and a sub-region SBA protruding from one side of the main region MA.

The main region MA may include a display area DA, and a non-display area NDA disposed around (e.g., adjacent to) the display area DA.

The display area DA may be formed in a rectangular shape in a plan view having short sides extending in a first direction DR1 and long sides extending in a second direction DR2 crossing the first direction DR1. A corner where the short side extending in the first direction DR1 and the long side extending in the second direction DR2 meet each other may be rounded to have a suitable curvature (e.g., a predetermined curvature) or may be right-angled. The planar shape of the display area DA is not limited to the rectangular shape, and may be formed in another suitable polygonal shape, a circular shape, or an elliptical shape.

The display area DA may occupy most of the main region MA. The display area DA may be disposed at the center of the main region MA.

The non-display area NDA may be disposed at the edge of the main region MA to surround (e.g., around a periphery of) the display area DA.

The sub-region SBA may be a region protruding from the non-display area NDA of the main region MA to one side in the second direction DR2.

Because a part of the sub-region SBA may be transformed to be bent, another part of the sub-region SBA may be disposed on the rear surface of the display device 100.

FIGS. 2 and 3 illustrate the display device 100 with the part of the sub-region SBA in a bent state.

As shown in FIG. 3, the display device 100 includes the substrate 110, a circuit layer 120 disposed on the substrate 110, and a light emitting element layer 130 disposed on the circuit layer 120.

In addition, the display device 100 may further include an encapsulation layer 140 covering the light emitting element layer 130, and a touch sensor layer 150 disposed on the encapsulation layer 140.

The display device 100 may further include a display driving circuit 200.

Also, the display device 100 may further include a circuit board 300 and a touch driving circuit 400.

The display driving circuit 200 may be provided as an integrated circuit (IC), and mounted on the sub-region SBA of the substrate 110 by a chip on glass (COG) method, a chip on plastic (COP) method, or an ultrasonic bonding method. However, the present disclosure is not limited thereto, and the arrangement of the display driving circuit 200 is not limited to that illustrated in FIG. 3.

For example, the display driving circuit 200 may be attached to the circuit board 300 by a chip on film (COF) method.

The circuit board 300 may be bonded to signal pads SPD (e.g., see FIG. 5) disposed in the sub-region SBA of the substrate 110.

For example, the circuit board 300 may be attached and electrically connected to the signal pads SPD of the sub-region SBA using a low-resistance high-reliability material such as SAP, or an anisotropic conductive film.

The circuit board 300 may include a plurality of circuits for supplying digital video data, timing signals, and driving voltages to the circuit layer 120 and the display driving circuit 200.

The circuit board 300 may be a flexible printed circuit board, a printed circuit board, or a flexible film, such as a chip on film.

The touch driving circuit 400 may be electrically connected to the touch sensor layer 150.

The touch driving circuit 400 may apply a touch driving signal to driving lines of the touch sensor layer 150, and detect charge variation amounts of capacitances based on a touch sensing signal received from sensing lines, thereby determining whether or not a user has touched or approached a relevant surface of the display device 100. The user's touch refers to a contact of the user's finger or an object such as a pen with the display device 100. The user's approach refers to hovering of the user's finger or the object such as the pen at a suitable distance from the display device 100.

Figure 4:
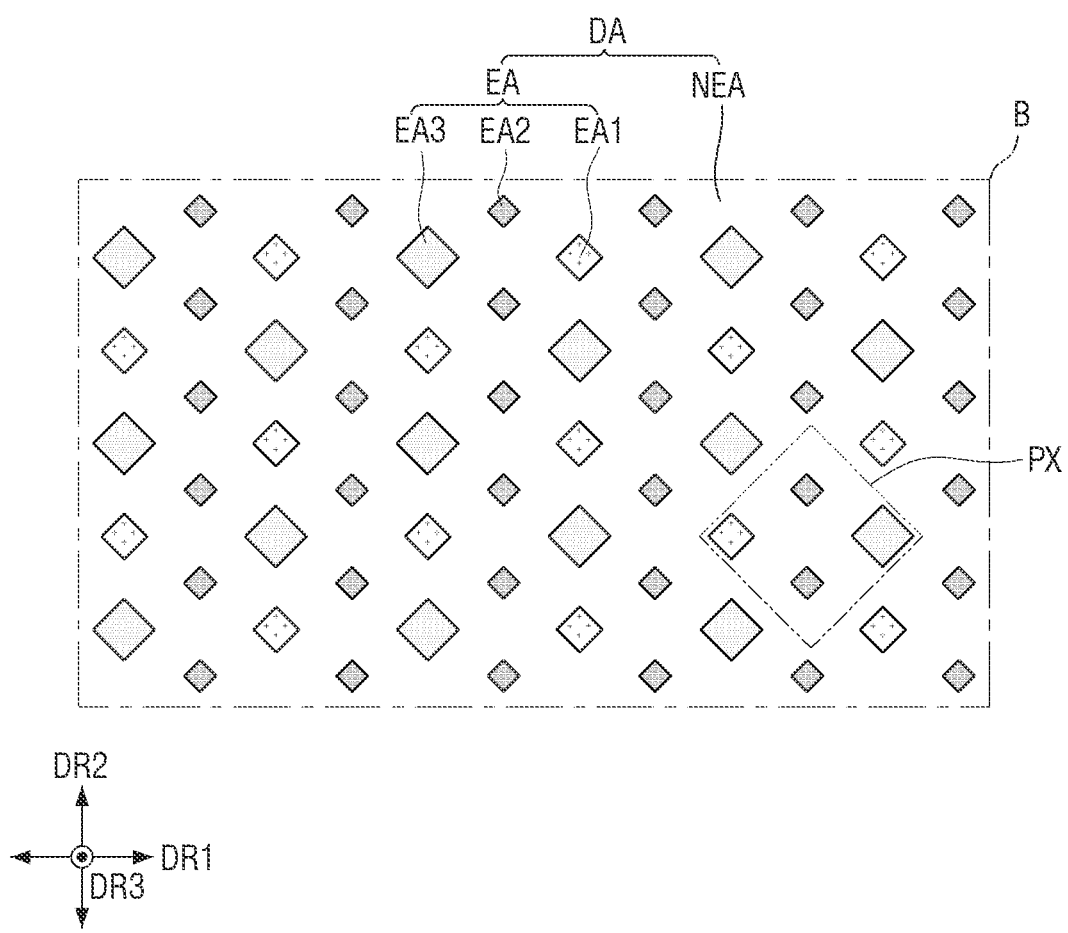
FIG. 4 is a layout diagram illustrating an enlarged view of the part B of FIG. 2.

FIG. 4 is a layout diagram illustrating an enlarged view of the part B of FIG. 2.

Referring to FIG. 4, emission areas EA may be arranged in the display area DA of the substrate 110.

In other words, the display area DA may include the emission areas EA arranged side by side with one another, and a non-emission area NEA that is a separation region between the emission areas EA.

The emission areas EA may have a rhombus planar shape or a rectangular planar shape. However, the present disclosure is not limited thereto, and the planar shape of the emission areas EA is not limited to that illustrated in FIG. 4. In other words, the emission areas EA may have a polygonal planar shape, such as a quadrangle, a pentagon, or a hexagon, or may have a circular planar shape or an elliptical planar shape with a curved edge.

The emission areas EA may include first emission areas EA1 for emitting light of a first color in a suitable wavelength band (e.g., a predetermined wavelength band), second emission areas EA2 for emitting light of a second color in a wavelength band lower than that of the first color, and third emission areas EA3 for emitting light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

The first emission areas EA1 and the third emission areas EA3 may be alternately arranged with each other along at least one of the first direction DR1 and/or the second direction DR2.

The second emission areas EA2 may be arranged side by side with one another in at least one of the first direction DR1 and/or the second direction DR2.

Pixels PX for displaying respective luminance and color may be provided by the first emission area EA1, the second emission area EA2, and the third emission area EA3 that are adjacent to each other from among the emission areas EA.

In other words, each of the pixels PXs may be a basic unit for displaying various colors including white at a desired luminance (e.g., a predetermined luminance).

Each of the pixels PX may include at least one first emission area EA1, at least one second emission area EA2, and at least one third emission area EA3 that are adjacent to each other. Accordingly, each of the pixels PX may display various colors by mixing light emitted from the first emission area EA1, the second emission area EA2, and the third emission area EA3 that are adjacent to each other.

Figure 5:
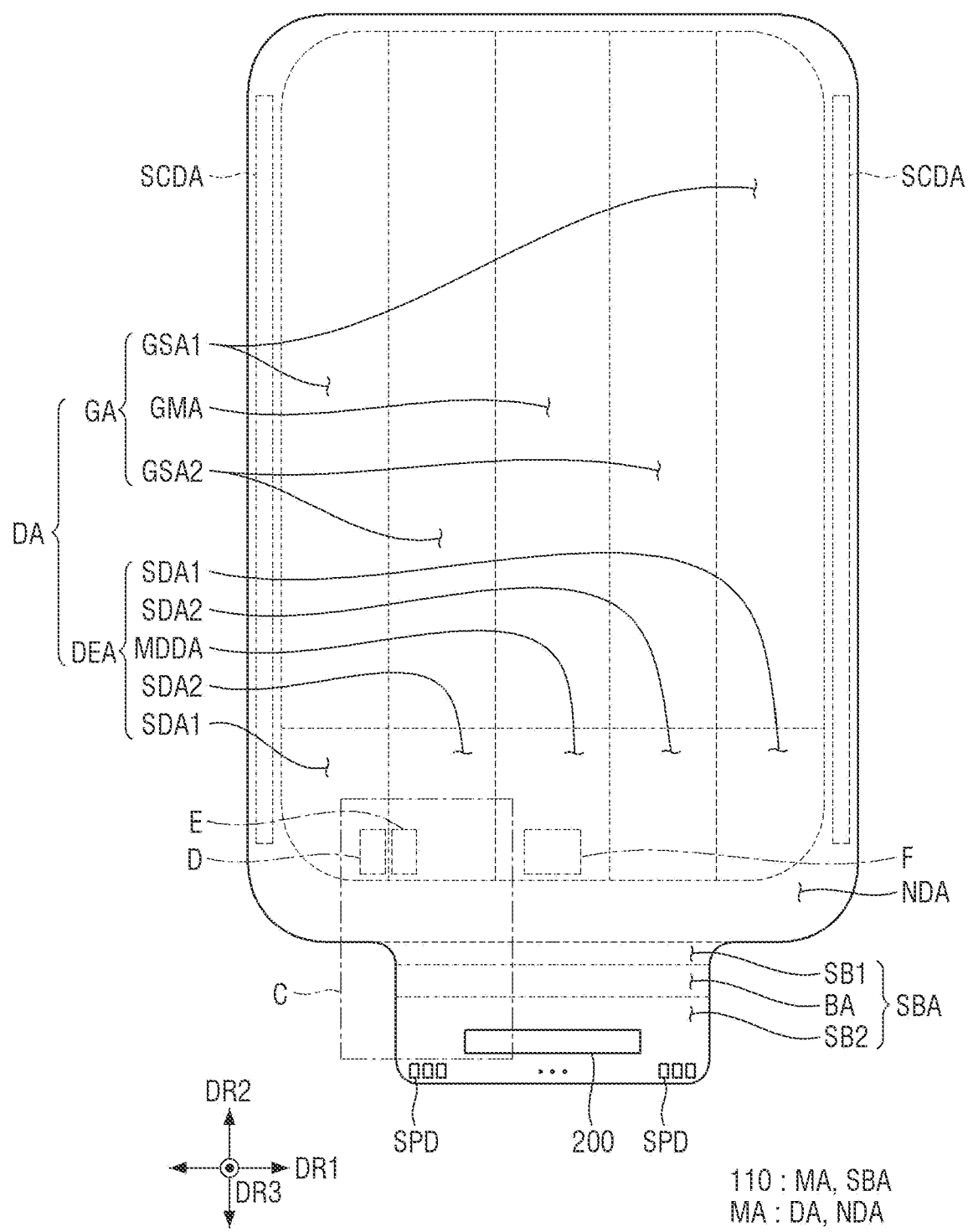
FIG. 5 is a plan view illustrating the main region and the sub-region of the display device of FIG. 1.

FIG. 5 is a plan view illustrating the main region and the sub-region of the display device of FIG. 1.

Referring to FIG. 5, the substrate 110 of the display device 100 according to an embodiment includes the main region MA including the display area DA and the non-display area NDA, and the sub-region SBA protruding from one side of the main region MA.

The display area DA may include a bypass area DEA disposed on one side of the display area DA adjacent to the sub-region SBA, and a general area GA disposed in the remaining area of the display area DA excluding the bypass area DEA.

The bypass area DEA includes a bypass middle area MDDA, a first bypass side area SDA1, and a second bypass side area SDA2. The bypass middle area MDDA may be disposed at the center of the bypass area DEA in the first direction DR1. The first bypass side area SDA1 may be parallel to or substantially parallel to the bypass middle area MDDA in the first direction DR1, and may be in contact with the non-display area NDA. The second bypass side area SDA2 may be disposed between the bypass middle area MDDA and the first bypass side area SDA1.

The first bypass side area SDA1 may be disposed closer to a corner (e.g., a curved or bent corner) of the substrate 110 than the bypass middle area MDDA and the second bypass side area SDA2.

The first bypass side area SDA1 and the second bypass side area SDA2 may be disposed between the bypass middle area MDDA and the non-display area NDA on both sides (e.g., opposite sides) of the bypass middle area MDDA in the first direction DR1.

The general area GA may include a general middle area GMA, a first general side area GSA1, and a second general side area GSA2. The general middle area GMA may be connected to the bypass middle area MDDA of the bypass area DEA in the second direction DR2. The first general side area GSA1 may be connected to the first side area SDA1 of the bypass area DEA in the second direction DR2. The second general side area GSA2 may be connected to the second side area SDA2 of the bypass area DEA in the second direction DR2.

The non-display area NDA may include a scan driving circuit area SCDA in which a scan driving circuit may be disposed.

The scan driving circuit area SCDA may be disposed in the non-display area NDA adjacent to at least one side of the display area DA in the first direction DR1.

The sub-region SBA may include a bending region BA that is transformed into a bent shape, a first sub-region SB1 disposed between one side of the bending region BA and the main region MA, and a second sub-region SB2 connected to the other side (e.g., an opposite side) of the bending region BA.

When the bending region BA is transformed into the bent shape, the second sub-region SB2 is disposed under the substrate 110 and overlaps with the main region MA.

The display driving circuit 200 may be disposed in the second sub-region SB2.

The signal pads SPD bonded to the circuit board 300 may also be disposed in the second sub-region SB2.

Figure 6:
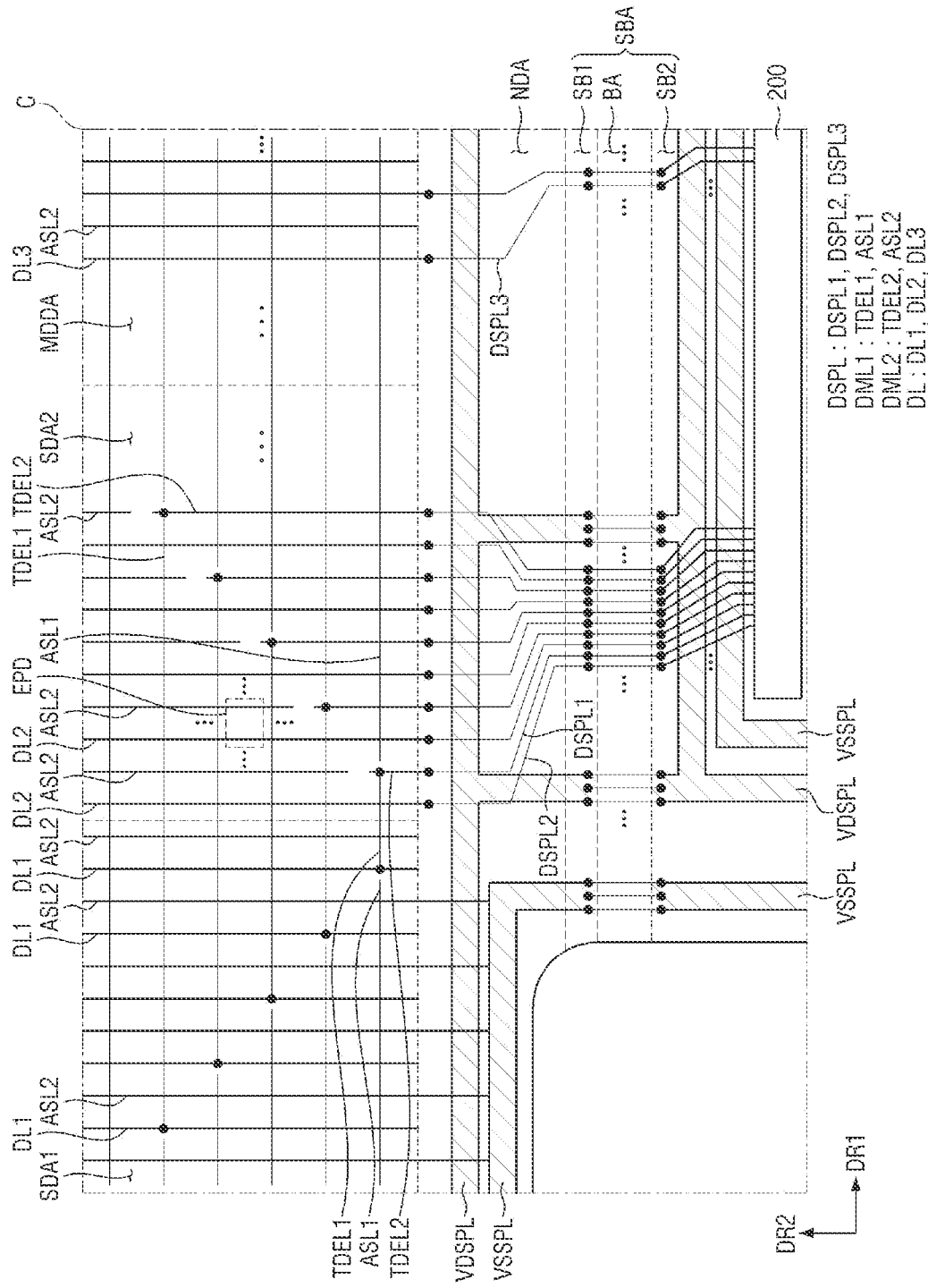
FIG. 6 is a layout diagram illustrating an enlarged view of the part C of FIG. 5.

FIG. 6 is a layout diagram illustrating an enlarged view of the part C of FIG. 5.

Referring to FIG. 6, the circuit layer 120 of the display device 100 according to an embodiment includes a plurality of light emitting pixel drivers EPD electrically connected to the light emitting elements of the element layer 130 respectively disposed in the emission areas EA and arranged side by side with one another. The circuit layer 120 may further include data lines DL for transmitting a data signal Vdata (e.g., see FIG. 11) to the light emitting pixel drivers EPD, first dummy lines DML1 extending in the first direction DR1 and crossing the data lines DL, and second dummy lines DML2 extending parallel to or substantially parallel to the data lines DL and paired with the data lines DL, respectively.

The data lines DL and the second dummy lines DML2 may extend in the second direction DR2.

The circuit layer 120 may further include data supply lines DSPL disposed in the non-display area NDA, and electrically connected to the display driving circuit 200.

The data supply lines DSPL electrically connect the display driving circuit 200 to the data lines DL.

The data lines DL may include a first data line DL1 disposed in the first bypass side area SDA1, and a second data line DL2 disposed in the second bypass side area SDA2.

The first dummy lines DML1 may include a first transmission bypass line TDEL1 electrically connected to the first data line DL1 of the first bypass side area SDA1.

The second dummy lines DML2 may include a second transmission bypass line TDEL2 that is paired with the second data line DL2 of the second bypass side area SDA2 and electrically connected to the first transmission bypass line TDEL1.

The data supply lines DSPL may include a first data supply line DSPL1 for transmitting a data signal of the first data line DL1, and a second data supply line DSPL2 for transmitting a data signal of the second data line DL2.

The first data supply line DSPL1 may be electrically connected to the second transmission bypass line TDEL2.

Accordingly, the first data line DL1 may be electrically connected to the first data supply line DSPL1 through the first transmission bypass line TDEL1 and the second transmission bypass line TDEL2 disposed in the bypass area DEA of the display area DA.

In other words, similarly to the second data supply line DSPL2, even though the first data supply line DSPL1 extends to (e.g., only to) the second bypass side area SDA2 relatively adjacent to the sub-region SBA, an electrical connection between the first data line DL1 and the first data supply line DSPL1 may be implemented through the first transmission bypass line TDEL1 and the second transmission bypass line TDEL2.

Accordingly, because the first data supply line DSPL1 does not extend relatively long from the sub-region SBA to reach the first bypass side area SDA1 adjacent to the corner (e.g., the curved or bent corner) of the substrate 110, and is not disposed in a part of the non-display area NDA between the corner of the substrate 110 and the first bypass side area SDA1, the width of the non-display area NDA may be reduced.

The second data supply line DSPL2 may extend to the second bypass side area SDA2, and may be directly electrically connected to the second data line DL2.

The data lines DL may further include a third data line DL3 disposed in the bypass middle area MDDA. In addition, the data supply lines DSPL may further include a third data supply line DSPL3 for transmitting a data signal of the third data line DL3.

The third data supply line DSPL3 may extend to the bypass middle area MDDA, and may be directly electrically connected to the third data line DL3.

The first dummy lines DML1 may further include first auxiliary lines ASL1 in addition to the first transmission bypass line TDEL1.

The second dummy lines DML2 may further include second auxiliary lines ASL2 in addition to the second transmission bypass line TDEL2.

The first auxiliary lines ASL1 and the second auxiliary lines ASL2 may be included for reducing the visibility of the first transmission bypass line TDEL1 and the second transmission bypass line TDEL2 that are limitedly provided in (e.g., only in) the bypass area DEA.

The second transmission bypass line TDEL2 may be disposed between the non-display area NDA and the first transmission bypass line TDEL1.

In consideration of the visibility of the second transmission bypass line TDEL2, any one of the second auxiliary lines ASL2 may be disposed in line with the second transmission bypass line TDEL2 in the second direction DR2, and may extend from the second transmission bypass line TDEL2 to the non-display area NDA.

Accordingly, a part of the second data line DL2 may be paired with the second transmission bypass line TDEL2, and another part thereof may be paired with any one second auxiliary line ASL2 in line with the second transmission bypass line TDEL2.

Because the second transmission bypass line TDEL2 is disposed in (e.g., only in) the second bypass side area SDA2, the first data line DL1 of the first bypass side area SDA1 may be paired with the second auxiliary line ASL2 as a whole.

In addition, the third data line DL3 of the bypass middle area MDDA may be paired with the second auxiliary line ASL2 as a whole.

The circuit layer 120 may further include a first power supply line VDSPL and a second power supply line VSSPL that transmit a first power ELVDD (e.g., see FIG. 11) and a second power ELVSS, respectively, for driving the light emitting elements of the element layer 130.

The first power supply line VDSPL and the second power supply line VSSPL may be disposed in the non-display area NDA, and may extend to the sub-region SBA.

From among the signal pads SPD disposed in the second sub-region SB2, a first power pad for transmitting the first power ELVDD and a second power pad for transmitting the second power ELVSS may be electrically connected to the first power supply line VDSPL and the second power supply line VSSPL, respectively.

The first auxiliary lines ASL1 and the second auxiliary lines ASL2 may be electrically connected to the second power supply line VSSPL.

Figure 7:
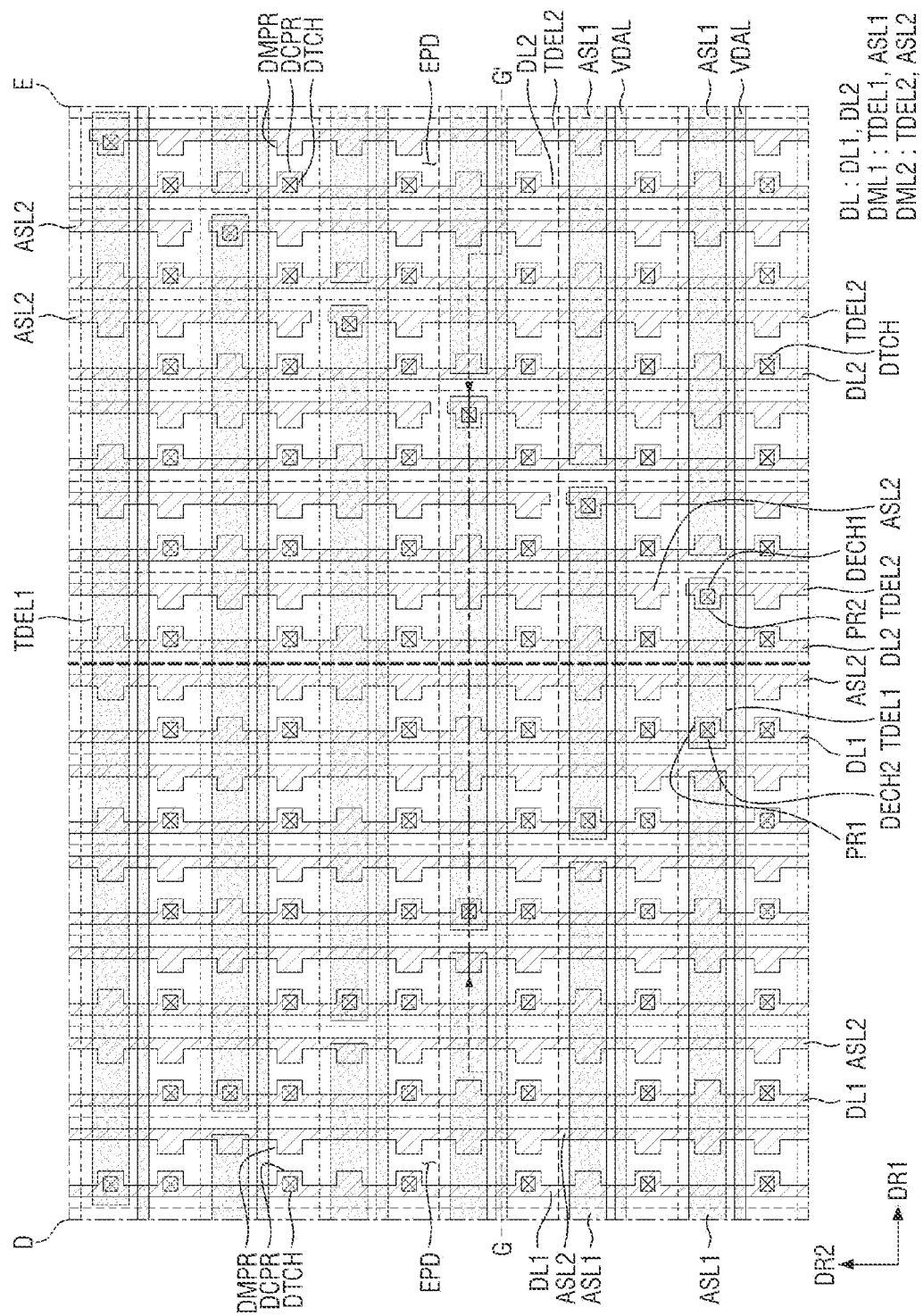
FIG. 7 is a plan view illustrating data lines, first dummy lines, and second dummy lines in enlarged views of the parts D and E of FIG. 5 according to a first embodiment.
Figure 8:
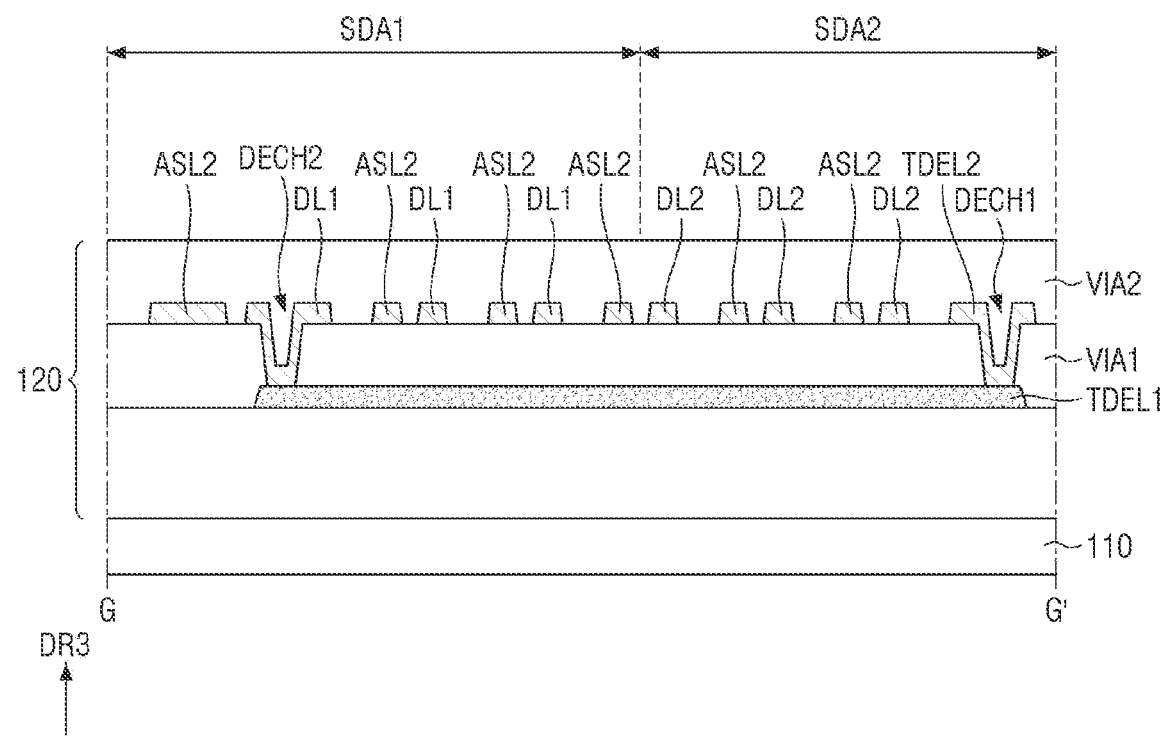
FIG. 8 is a cross-sectional view taken along the line G-G' of FIG. 7.

FIG. 7 is a plan view illustrating data lines, first dummy lines, and second dummy lines in enlarged views of the parts D and E of FIG. 5 according to a first embodiment. FIG. 8 is a cross-sectional view taken along the line G-G' of FIG. 7.

Part D of FIG. 7 shows a part of the first bypass side area SDA1 adjacent to the second bypass side area SDA2, and part E of FIG. 7 shows a part of the second bypass side area SDA2 adjacent to the first bypass side area SDA1.

Referring to FIG. 7, the light emitting pixel drivers EPD may be arranged side by side with one another in the first direction DR1 and the second direction DR2.

The light emitting pixel drivers EPD aligned with one another in the second direction DR2 may overlap with any one of the data lines DL, and may be electrically connected to one data line DL through data connection holes DTCH.

In other words, the light emitting pixel drivers EPD may be electrically connected to the data lines DL through the data connection holes DTCH.

The data lines DL may include connection protrusions DCPR that overlap with the data connection holes DTCH of the light emitting pixel drivers EPD.

In addition, considering the visibility of the connection protrusions DCPR, the second dummy lines DML2 may include dummy protrusions DMPR symmetrical to or substantially symmetrical to the connection protrusions DCPR.

The circuit layer 120 may further include first power auxiliary lines VDAL electrically connected to the first power supply line VDSPL. The first power auxiliar lines VDAL may extend in the first direction DR1, and may be disposed alternately with the first dummy lines DML1.

The first transmission bypass line TDEL1 may be disposed between the first data line DL1 and the second transmission bypass line TDEL2. In consideration of the visibility of the first transmission bypass line TDEL1, any two first auxiliary lines ASL1 may extend from both ends (e.g., opposite ends) of the first transmission bypass line TDEL1 to the non-display area NDA.

The first transmission bypass line TDEL1 may be electrically connected to the second transmission bypass line TDEL2 through a first bypass connection hole DECH1, and may be electrically connected to the first data line DL1 through a second bypass connection hole DECH2.

Referring to FIG. 8, the first data line DL1, the second data line DL2, the second transmission bypass line TDEL2, and the second auxiliary line ASL2 may be disposed on a via layer VIA1 that covers the first transmission bypass line TDEL1.

In other words, the data lines DL and the second dummy lines DML2 may be disposed on the via layer VIA1 that covers the first dummy lines DML1.

In addition, the first bypass connection hole DECH1 for electrical connection between the first transmission bypass line TDEL1 and the second transmission bypass line TDEL2, and the second bypass connection hole DECH2 for electrical connection between the first transmission bypass line TDEL1 and the first data line DL1 may each penetrate the via layer VIA1.

The data lines DL, the second dummy lines DML2, and the first dummy lines DML1 may be covered with a passivation layer VIA2.

As shown in FIG. 7, according to the first embodiment, the data lines DL and the second dummy lines DML2 may be alternately disposed with each other along the first direction DR1. In other words, any one of the second dummy lines DML2 may be disposed between two data lines DL.

Figure 9:
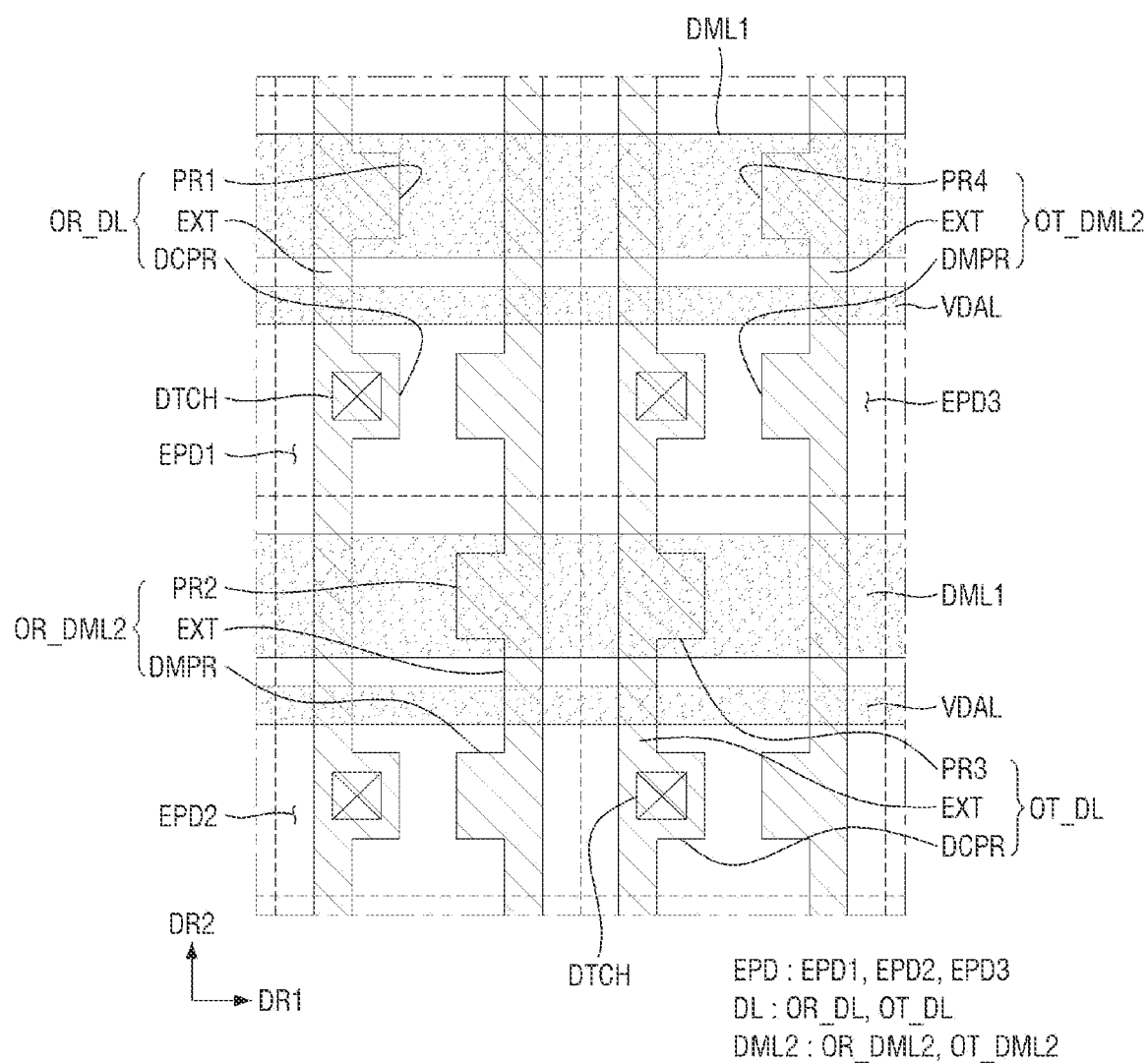
FIG. 9 is a plan view illustrating in more detail a data line and a first dummy line according to the first embodiment.

FIG. 9 is a plan view illustrating in more detail a data line and a first dummy line according to the first embodiment.

Referring to FIG. 9, each of the data lines DL and the second dummy lines DML2 includes an extension portion EXT extending in the second direction DR2.

One data line OR_DL of the data lines DL further includes first protrusions PR1 crossing some of the first dummy lines DML1.

In other words, one data line OR_DL may include the extension portion EXT, the first protrusions PR1, and the connection protrusions DCPR.

From among the second dummy lines DML2, one second dummy line OR_DML2 paired with one data line OR_DL further includes second protrusions PR2 crossing the rest of the first dummy lines DML1.

In other words, one second dummy line OR_DML2 may include the extension portion EXT, the second protrusions PR2, and the dummy protrusions DMPR.

According to the first embodiment, the first protrusions PR1 of one data line OR_DL cross some of (e.g., only some of) the first dummy lines DML1, rather than all of the first dummy lines DML1.

On the other hand, the second protrusions PR2 of one second dummy line OR_DML2 paired with the one data line OR_DL crosses the rest of (e.g., only the rest of) the first dummy lines DML1, except for the some of the first dummy lines DML1 crossing the first protrusions PR1.

If each of the one data line OR_DL and the one second dummy line OR_DML2 includes protrusions crossing all of the first dummy lines DML1, the total number of the protrusions disposed at crossing regions (e.g., intersections) between the first dummy lines DML1 and each of the one data line OR_DL and the one second dummy line OR_DML2 becomes twice the number of that of the first dummy lines DML1.

However, according to the first embodiment, the first protrusions PR1 cross some (e.g., only some) of the first dummy lines DML1, and the second protrusions PR2 cross the rest (e.g., only the rest) of the first dummy lines DML1. Thus, the total number of the first protrusions PR1 and the second protrusions PR2 may be reduced to the total number of the first dummy lines DML1.

Accordingly, the width of an area allocated for the arrangement of the first protrusions PR1 and the second protrusions PR2 in the display area DA may be reduced. Therefore, the number of the light emitting pixel drivers EPD that can be disposed in the display area DA may be increased, such that a high resolution may be implemented for the display device 100.

The light emitting pixel drivers EPD may include a first light emitting pixel driver EPD1, a second light emitting pixel driver EPD2 adjacent to the first light emitting pixel driver EPD1 in the second direction DR2, and a third light emitting pixel driver EPD3 adjacent to the first light emitting pixel driver EPD1 in the first direction DR1.

The first light emitting pixel driver EPD1 and the second light emitting pixel driver EPD2 may overlap with the one data line OR_DL.

The first light emitting pixel driver EPD1 may overlap one of the first protrusions PR1 included in the one data line OR_DL.

The second light emitting pixel driver EPD2 may overlap with one of the second protrusions PR2 of the one second dummy line OR_DML2.

From among the data lines DL, another data line OT_DL overlapping with the third light emitting pixel driver EPD3 may further include third protrusions PR3 disposed side by side with the second protrusions PR2, respectively.

From among the second dummy lines DML2, another second dummy line OT_DML2 paired with the other data line OT_DL may further include fourth protrusions PR4 disposed side by side with the first protrusions PR1, respectively.

According to the first embodiment, one second dummy line OR_DML2 may be disposed between one data line OR_DL and another data line OT_DL. In addition, one second dummy line OR_DML2 may be disposed closer to another data line OT_DL than to the one data line OR_DL paired therewith.

In other words, the extension portion EXT of the one second dummy line OR_DML2 may be adjacent to the extension portion EXT of the other data line OT_DL.

According to the first embodiment, the first protrusions PR1 of one data line OR_DL may face the extension portion EXT of one second dummy line OR_DML2, and the second protrusions PR2 of the one second dummy line OR_DML2 may face the extension portion EXT of the one data line OR_DL.

In other words, the first protrusions PR1 of one data line OR_DL and the second protrusions PR2 of one second dummy line OR_DML2 may be alternately arranged with each other one by one at the light emitting pixel drivers EPD aligned with each other in the second direction DR2.

According to the first embodiment, the first protrusions PR1 of the data line OR_DL and the fourth protrusions PR4 of the second dummy line OT_DML2 may be alternately arranged with each other one by one at the light emitting pixel drivers EPD aligned with each other in the first direction DR1.

In addition, the second protrusions PR2 of the second dummy line OR_DML2 and the third protrusions PR3 of the data line OT_DL may be alternately arranged with each other one by one at the light emitting pixel drivers EPD aligned with each other in the first direction DR1.

As described above, according to the first embodiment, the protrusions PR1 and PR3 of the data lines DL and the protrusions PR2 and PR4 of the second dummy lines DML2, which cross the first dummy lines DML1, may be alternately arranged with each other one by one in a zigzag shape in the first and second directions DR1 and DR2.

As a result, even when the total number of the protrusions PR1 and PR3 of the data lines DL and the protrusions PR2 and PR4 of the second dummy lines DML2 crossing the first dummy lines DML1 is reduced, a significant increase in the visibility of the protrusions PR1 and PR3 of the data lines DL and the protrusions PR2 and PR4 of the second dummy lines DML2 may be prevented or substantially prevented due to the relatively regular and symmetrical arrangement thereof.

As shown in FIG. 7, the first bypass connection hole DECH1 for electrical connection between the first transmission bypass line TDEL1 and the second transmission bypass line TDEL2 may be disposed in the second protrusion PR2. In addition, the second bypass connection hole DECH2 for electrical connection between the first transmission bypass line TDEL1 and the first data line DL1 may be disposed in the first protrusion PR1.

Accordingly, even though the total number of the protrusions PR1, PR2, PR3, and PR4 crossing the first dummy lines DML1 is reduced, the first bypass connection holes DECH1 may be arranged side by side with each other in a diagonal direction (e.g., a predetermined diagonal direction) crossing the first and second directions DR1 and DR2, and the second bypass connection holes DECH2 may be arranged side by side with each other in a diagonal direction (e.g., a predetermined diagonal direction).

In other words, even though the total number of the protrusions PR1, PR2, PR3, and PR4 crossing the first dummy lines DML1 is reduced, the first transmission bypass lines TDEL1 may be arranged sequentially with the first power auxiliary line VDAL interposed therebetween.

Therefore, regardless of the reduction in the total number of the protrusions PR1, PR2, PR3, and PR4 crossing the first dummy lines DML1, an electrical connection path between the second transmission bypass line TDEL2, the first transmission bypass line TDEL1, and the first data line DL1 may be maintained.

Figure 10:
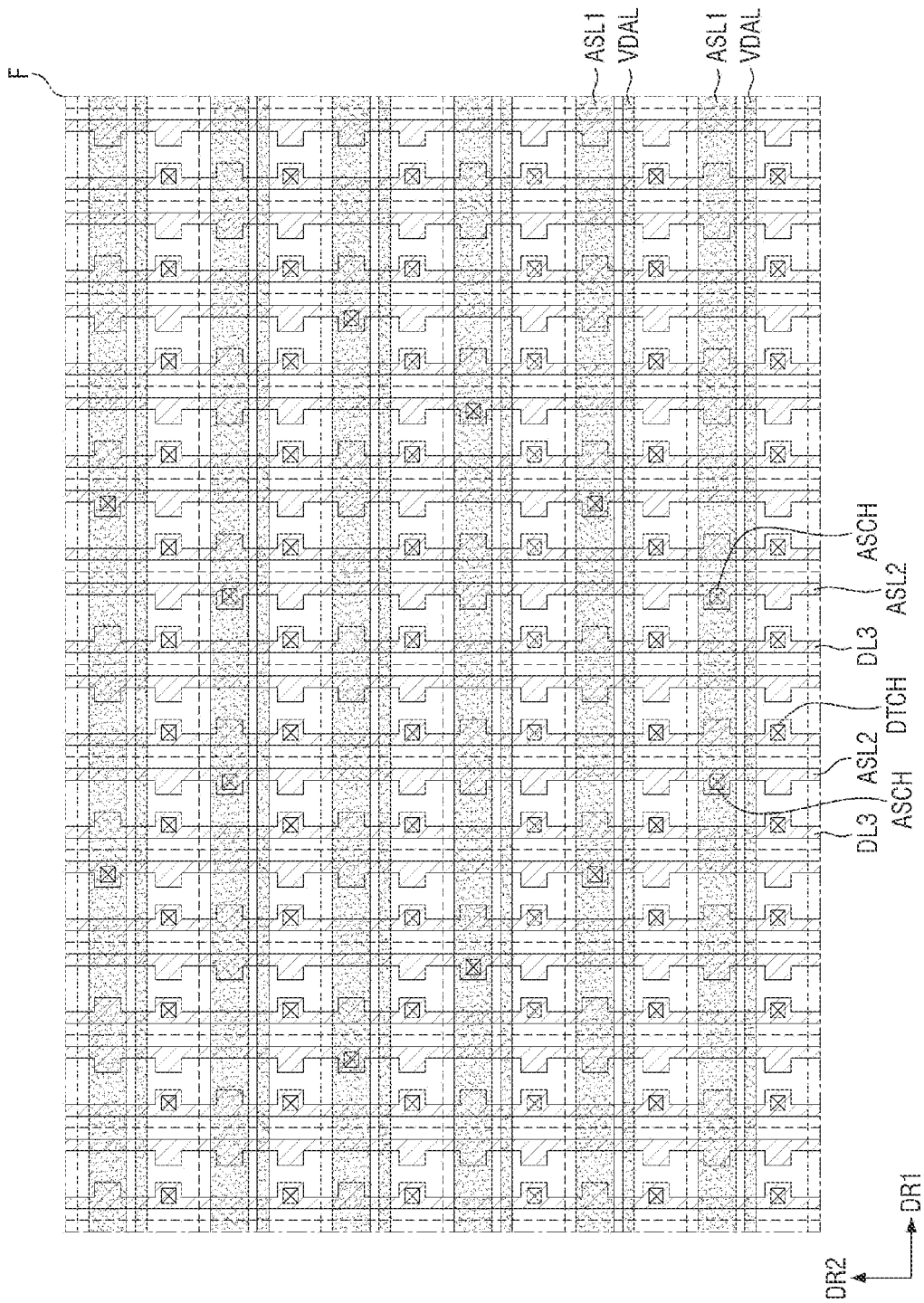
FIG. 10 is a plan view illustrating data lines, first dummy lines, and second dummy lines in an enlarged view of the part F of FIG. 5 according to the first embodiment.

FIG. 10 is a plan view illustrating data lines, first dummy lines, and second dummy lines in an enlarged view of the part F of FIG. 5 according to the first embodiment.

FIG. 10 shows a part of the bypass middle area MDDA.

Referring to FIG. 10, the data lines DL may include the third data line DL3 disposed in the bypass middle area MDDA. The third data line DL3 may be paired with the second auxiliary line ASL2 as a whole.

In the bypass middle area MDDA, each of the first auxiliary lines ASL1 may be electrically connected to at least one second auxiliary line ASL2 through an auxiliary connection hole ASCH.

The auxiliary connection holes ASCH may be arranged in a predetermined diagonal direction crossing the first and second directions DR1 and DR2.

Figure 11:
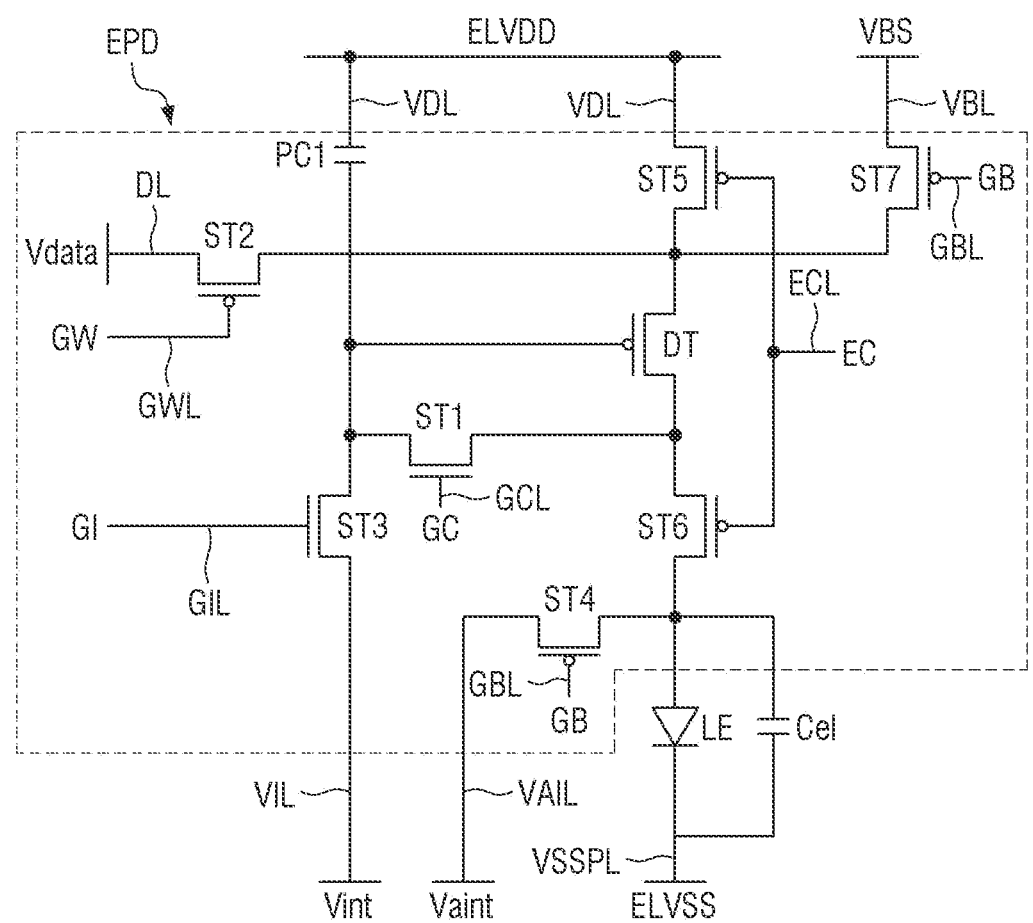
FIG. 11 is an equivalent circuit diagram showing the light emitting pixel driver of FIG. 6.

FIG. 11 is an equivalent circuit diagram showing the light emitting pixel driver of FIG. 6.

Referring to FIG. 11, the light emitting pixel drivers EPD of the circuit layer 120 are electrically connected to the light emitting elements LE of the element layer 130, respectively.

The circuit layer 120 may further include a first power line VDL for transmitting the first power ELVDD, a first initialization power line VIL for transmitting a first initialization power Vint, a second initialization power line VAIL for transmitting a second initialization power Vaint, and a bias power line VBL for transmitting a bias power VBS.

In addition, the circuit layer 120 may further include a scan write line GWL for transmitting a scan write signal GW, a scan initialization line GIL for transmitting a scan initialization signal GI, an emission control line ECL for transmitting an emission control signal EC, a gate control line GCL for transmitting a gate control signal GC, and a bias control line GBL for transmitting a bias control signal GB.

Each of the light emitting pixel drivers EPD may include a driving transistor DT that generates a driving current for driving the light emitting element LE electrically connected to one light emitting pixel driver EPD, two or more transistors ST1 to ST7 electrically connected to the driving transistor DT, and at least one capacitor PC1.

An anode electrode 131 (e.g., see FIG. 12) of the light emitting element LE may be electrically connected to the light emitting pixel driver EPD, and a cathode electrode 134 of the light emitting element LE may be electrically connected to a second power supply line VSSPL for transmitting a second driving power ELVSS that has a voltage level lower than that of the first power ELVDD.

The light emitting element LE may be an organic light emitting diode having a light emitting layer including (e.g., made of) an organic light emitting material. In another embodiment, the light emitting element LE may be an inorganic light emitting element including a light emitting layer including (e.g., made of) an inorganic semiconductor. In another embodiment, the light emitting element LE may be a quantum dot light emitting element including a quantum dot light emitting layer. In another embodiment, the light emitting element LE may be a micro light emitting diode.

A capacitor Cel illustrated as being connected in parallel or substantially in parallel with the light emitting element LE in FIG. 11 refers to a parasitic capacitance between the anode electrode 131 and the cathode electrode 134.

The driving transistor DT is connected in series to the light emitting element LE between the first power line VDL and the second power line VSSPL. In other words, the first electrode (e.g., the source electrode) of the driving transistor DT may be electrically connected to the first power line VDL through the fifth transistor ST5. Further, the second electrode (e.g., the drain electrode) of the driving transistor DT may be electrically connected to the anode electrode 131 of the light emitting element LE through the sixth transistor ST6.

The first electrode of the driving transistor DT may be electrically connected to the data line DL through the second transistor ST2.

The gate electrode of the driving transistor DT may be electrically connected to the first power line VDL through the first capacitor PC1. In other words, the first capacitor PC1 may be electrically connected between the gate electrode of the driving transistor DT and the first power line VDL.

Accordingly, the potential of the gate electrode of the driving transistor DT may be maintained or substantially maintained by the first power ELVDD of the first power line VDL.

Accordingly, when the data signal Vdata of the data line DL is transmitted to the first electrode of the driving transistor DT through the turned-on second transistor ST2, a voltage difference corresponding to the data signal Vdata and the first power ELVDD may be generated between the gate electrode of the driving transistor DT and the first electrodes of the driving transistor DT.

In this case, when the voltage difference between the gate electrode of the driving transistor DT and the first electrode of the driving transistor DT, or in other words, the gate-source voltage difference, is greater than or equal to a threshold voltage, the driving transistor DT may be turned on.

Subsequently, when the fifth transistor ST5 and the sixth transistor ST6 are turned on, the driving transistor DT may be connected in series with the light emitting element LE between the first power line VDL and the second power line VSSPL. Accordingly, a drain-source current corresponding to the data signal Vdata may be generated by the turned-on driving transistor DT and may be supplied as a driving current of the light emitting element LE.

Accordingly, the light emitting element LE may emit light having a luminance corresponding to the data signal Vdata.

The second transistor ST2 may be connected between the first electrode of the driving transistor DT and the data line DL. The second transistor ST2 may be turned on by the scan write signal GW of the scan write line GWL.

The first transistor ST1 may be connected between the gate electrode of the driving transistor DT and the second electrode of the driving transistor DT. The first transistor ST1 may be turned on by the gate control signal GC of the gate control line GCL.

The third transistor ST3 may be connected between the gate electrode of the driving transistor DT and the first initialization power line VIL. The third transistor ST3 may be turned on by the scan initialization signal GI of the scan initialization line GIL.

The first transistor ST1 and the third transistor ST3 may be provided with N-type MOSFETs.

A fourth transistor ST4 may be connected between the anode electrode of the light emitting element LE and the second initialization power line VAIL. The fourth transistor ST4 may be turned on by the bias control signal GB of the bias control line GBL.

The fifth transistor ST5 may be connected between the first electrode of the driving transistor DT and the first power line VDL.

The sixth transistor ST6 may be connected between the second electrode of the driving transistor DT and the anode electrode of the light emitting element LE.

The fifth transistor ST5 and the sixth transistor ST6 may be turned on by the emission control signal EC of the emission control line ECL.

The seventh transistor ST7 may be connected between the first electrode of the driving transistor DT and the bias power line VBL.

The seventh transistor ST7 may be turned on by the bias control signal GB of the bias control line GBL.

Figure 12:
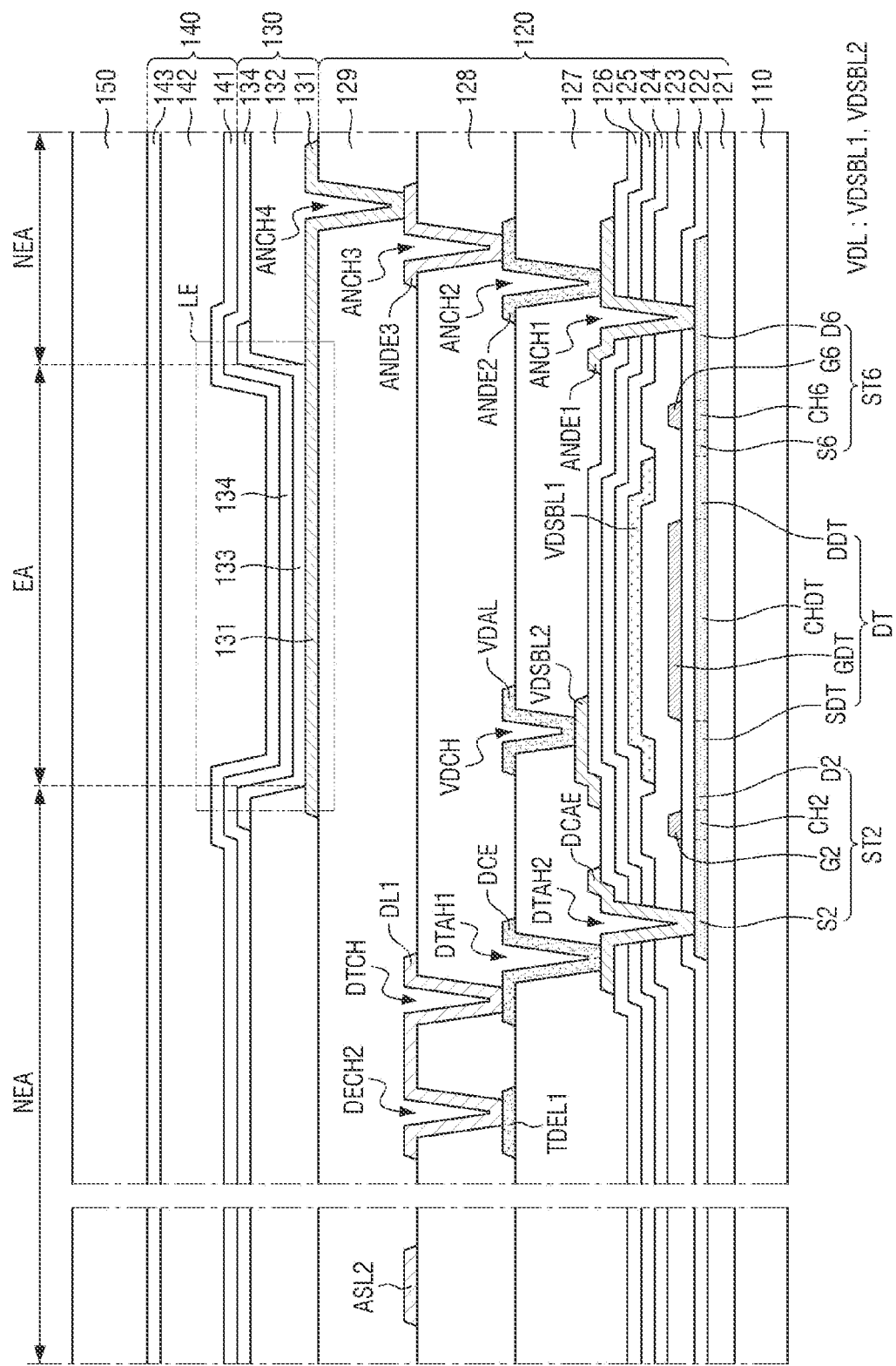
FIG. 12 is a cross-sectional view illustrating a light emitting element and a part of the light emitting pixel driver of FIG. 11.

FIG. 12 is a cross-sectional view illustrating a light emitting element and a part of the light emitting pixel driver of FIG. 11.

The cross-sectional view of FIG. 12 shows the light emitting pixel driver EPD of a part of one emission area EA disposed in the first bypass side area SDA1, and a part of the non-emission area NEA disposed around (e.g., adjacent to) the one emission area EA.

Referring to FIG. 12, the display device 100 according to the first embodiment may include the substrate 110, the circuit layer 120 disposed on the substrate 110, the element layer 130 disposed on the circuit layer 120, the encapsulation layer 140 disposed on the element layer 130, and the touch sensor layer 150 disposed on the encapsulation layer 140.

The circuit layer 120 includes the light emitting pixel drivers EPD corresponding to the emission areas EA, respectively.

The light emitting pixel drivers EPD may include the driving transistor DT, the first to seventh transistors ST1 to ST7, and at least one capacitor PC1.

The circuit layer 120 may further include the scan write line GWL, the scan initialization line GIL, the emission control line ECL, the gate control line GCL, and the bias control line GBL, which are electrically connected to the gate electrode of the driving transistor DT and the gate electrodes of the first to seventh transistors ST1 to ST7.

Further, the circuit layer 120 may include the data line DL, the first power line VDL, the first initialization power line VIL, the second initialization power line VAIL, and the bias power line VBL, which are electrically connected to the driving transistor DT and the first to seventh transistors ST1 to ST7.

Each of the driving transistor DT and the first to seventh transistors ST1 to ST7 may include a channel portion, a source portion, and a drain portion formed of a semiconductor layer, and a gate electrode formed of a conductive layer overlapping with the channel portion. The channel portion may be disposed between the source portion and the drain portion.

FIG. 12 illustrates the driving transistor DT, and the second and sixth transistors ST2 and ST6 from among the first to seventh transistors ST1 to ST7.

The circuit layer 120 may include a buffer layer 121 covering the substrate 110, a first semiconductor layer CHDT, SDT, DDT, CH2, S2, D2, CH6, S6, and D6 disposed on the buffer layer 121, a first gate insulating layer 122 covering the first semiconductor layer, a first gate conductive layer GDT, G2, and G6 disposed on the first gate insulating layer 122, a second gate insulating layer 123 covering the first gate conductive layer, a second gate conductive layer VDSBL1 disposed on the second gate insulating layer 123, a first interlayer insulating layer 124 covering the second gate conductive layer, a second semiconductor layer disposed on the first interlayer insulating layer 124, a third gate insulating layer 125 covering the second semiconductor layer, a third gate conductive layer disposed on the third gate insulating layer 125, a second interlayer insulating layer 126 covering the third gate conductive layer, a first source/drain conductive layer ANDE1, VDSBL2, and DCAE disposed on the second interlayer insulating layer 126, a first planarization layer 127 covering the first source/drain conductive layer, a second source/drain conductive layer ANDE2, VDAL, DCE, and TDEL1 disposed on the first planarization layer 127, a second planarization layer 128 covering the second source/drain conductive layer, and a third source/drain conductive layer ANDE3, DL1, and ASL2 disposed on the second planarization layer 128.

The driving transistor DT may include a channel portion CHDT, a source portion SDT, and a drain portion DDT formed form the first semiconductor layer on the buffer layer 121, and a gate electrode GDT disposed on the first gate insulating layer 122 and overlapping with the channel portion CHDT.

The second transistor ST2 may include a channel portion CH2, a source portion S2, and a drain portion D2 formed from the first semiconductor layer on the buffer layer 121, and a gate electrode G2 disposed on the first gate insulating layer 122 and overlapping with the channel portion CH2.

The sixth transistor ST6 may include a channel portion CH6, a source portion S6, and a drain portion D6 formed from the first semiconductor layer on the buffer layer 121, and a gate electrode G6 disposed on the first gate insulating layer 122 and overlapping with the channel portion CH6.

The anode electrode 131 of the light emitting element LE of the element layer 130 may be disposed on a third planarization layer 129.

The anode electrode 131 may be electrically connected to the drain portion D6 of the sixth transistor ST6 through a first anode connection electrode ANDE1, a second anode connection electrode ANDE2, and a third anode connection electrode ANDE3.

The first anode connection electrode ANDE1 may be formed from the first source/drain conductive layer on the second interlayer insulating layer 126.

The first anode connection electrode ANDE1 may be electrically connected to the drain portion D6 of the sixth transistor ST6 through a first anode connection hole ANCH1 penetrating the second interlayer insulating layer 126, the third gate insulating layer 125, the first interlayer insulating layer 124, the second gate insulating layer 123, and the first gate insulating layer 122.

The second anode connection electrode ANDE2 may be formed from the second source/drain conductive layer on the first planarization layer 127.

The second anode connection electrode ANDE2 may be electrically connected to the first anode connection electrode ANDE1 through a second anode connection hole ANCH2 penetrating the first planarization layer 127.

The third anode connection electrode ANDE3 may be formed from the third source/drain conductive layer on the second planarization layer 128.

The third anode connection electrode ANDE3 may be electrically connected to the second anode connection electrode ANDE2 through a third anode connection hole ANCH3 penetrating the second planarization layer 128.

The anode electrode 131 may be electrically connected to the third anode connection electrode ANDE3 through a fourth anode connection hole ANCH4 penetrating the third planarization layer 129.

The fourth transistor ST4, the fifth transistor ST5, and the seventh transistor ST7 may be provided as P-type MOSFETs by the first semiconductor layer and the first gate conductive layer, similarly to those of the driving transistor DT, the second transistor ST2, and the sixth transistor ST6. The fourth transistor ST4, the fifth transistor ST5, and the seventh transistor ST7 may have the same or substantially the same structure as that of the driving transistor DT, the second transistor ST2, and the sixth transistor ST6, and thus, redundant description thereof may not be repeated.

The first and third transistors ST1 and ST3 of the first to seventh transistors ST1 to ST7 may be provided as N-type MOSFETs by the second semiconductor layer on the first interlayer insulating layer 124, and the third gate conductive layer on the third gate insulating layer 125.

The first power line VDL may include a first power sub-line VDSBL1 formed from the second gate conductive layer on the second gate insulating layer 123, and a second power sub-line VDSBL2 formed from the first source/drain conductive layer on the second interlayer insulating layer 126.

The first capacitor PC1 may be provided by an overlapping region between the gate electrode GDT of the driving transistor DT and the first power sub-line VDSBL1.

The first power sub-line VDSBL1 and the second power sub-line VDSBL2 may be electrically connected to each other.

In addition, the first power auxiliary line VDAL may be electrically connected to the second power sub-line VDSBL2 through a first power connection hole VDCH.

The first dummy lines DML1 including the first transmission bypass line TDEL1 may be formed from the second source/drain conductive layer on the first planarization layer 127, together with the first power auxiliary line VDAL.

The data lines DL including the first data line DL1 and the second dummy lines DML2 including the second auxiliary line ASL2 may be formed from the third source/drain conductive layer on the second planarization layer 128.

In this case, the via layer VIA1 (e.g., see FIG. 8) may include the second planarization layer 128, and the passivation layer VIA2 may include the third planarization layer 129.

The first data line DL1 may be electrically connected to the source portion S2 of the second transistor ST2 through a data connection electrode DCE and a data connection auxiliary electrode DCAE.

The data connection electrode DCE may be formed from the second source/drain conductive layer on the first planarization layer 127.

The first data line DL1 may be electrically connected to the data connection electrode DCE through a data connection hole DTCH penetrating the second planarization layer 128.

The data connection auxiliary electrode DCAE may be formed from the first source/drain conductive layer on the second interlayer insulating layer 126.

The data connection electrode DCE may be electrically connected to the data connection auxiliary electrode DCAE through a first data connection auxiliary hole DTAH1 penetrating the first planarization layer 127.

The data connection auxiliary electrode DCAE may be electrically connected to the source portion S2 of the second transistor ST2 through a second data connection auxiliary hole DTAH2 penetrating the second interlayer insulating layer 126, the third gate insulating layer 125, the first interlayer insulating layer 124, the second gate insulating layer 123, and the first gate insulating layer 122.

The element layer 130 may include the light emitting elements LE disposed on the third planarization layer 129, and corresponding to the emission areas EA, respectively.

Each of the light emitting elements LE may include a corresponding anode electrode 131, the cathode electrode 134 facing or opposite to the corresponding anode electrode 131, and a corresponding light emitting layer 133 disposed therebetween.

In another embodiment, each of the light emitting elements LE may further include a first common layer disposed between the corresponding anode electrode 131 and the corresponding light emitting layer 133, and a second common layer disposed between the corresponding light emitting layer 133 and the cathode electrode 134.

In other words, the element layer 130 may include the anode electrodes 131 respectively corresponding to the emission areas EA, a pixel defining layer 132 corresponding to the non-emission area NEA and covering the edges of the anode electrodes 131, the light emitting layers 133 respectively disposed on the anode electrodes 131, and the cathode electrode 134 disposed on the light emitting layers 133 and the pixel defining layer 132.

The anode electrode 131 may be disposed for each of the emission areas EA, and may be electrically connected to one corresponding light emitting pixel driver EPD of the circuit layer 120. The anode electrode 131 may be referred to as a pixel electrode.

The light emitting layer 133 may be formed of an organic light emitting material that converts electron-hole pairs into light.

The encapsulation layer 140 may be disposed on the circuit layer 120 and cover the element layer 130.

The encapsulation layer 140 may include a first encapsulation layer 141, a second encapsulation layer 142 disposed on the first encapsulation layer 141, and a third encapsulation layer 143 disposed on the second encapsulation layer 142. The first encapsulation layer disposed on the element layer 130 may include (e.g., may be made of) an inorganic insulating material. The second encapsulation layer 142 disposed on the first encapsulation layer 141 may overlap with the element layer 130, and may include (e.g., may be made of) an organic insulating material. The third encapsulation layer 143 disposed on the first encapsulation layer 141 to cover the second encapsulation layer 142 may include (e.g., made of) an inorganic insulating material.

Figure 13:
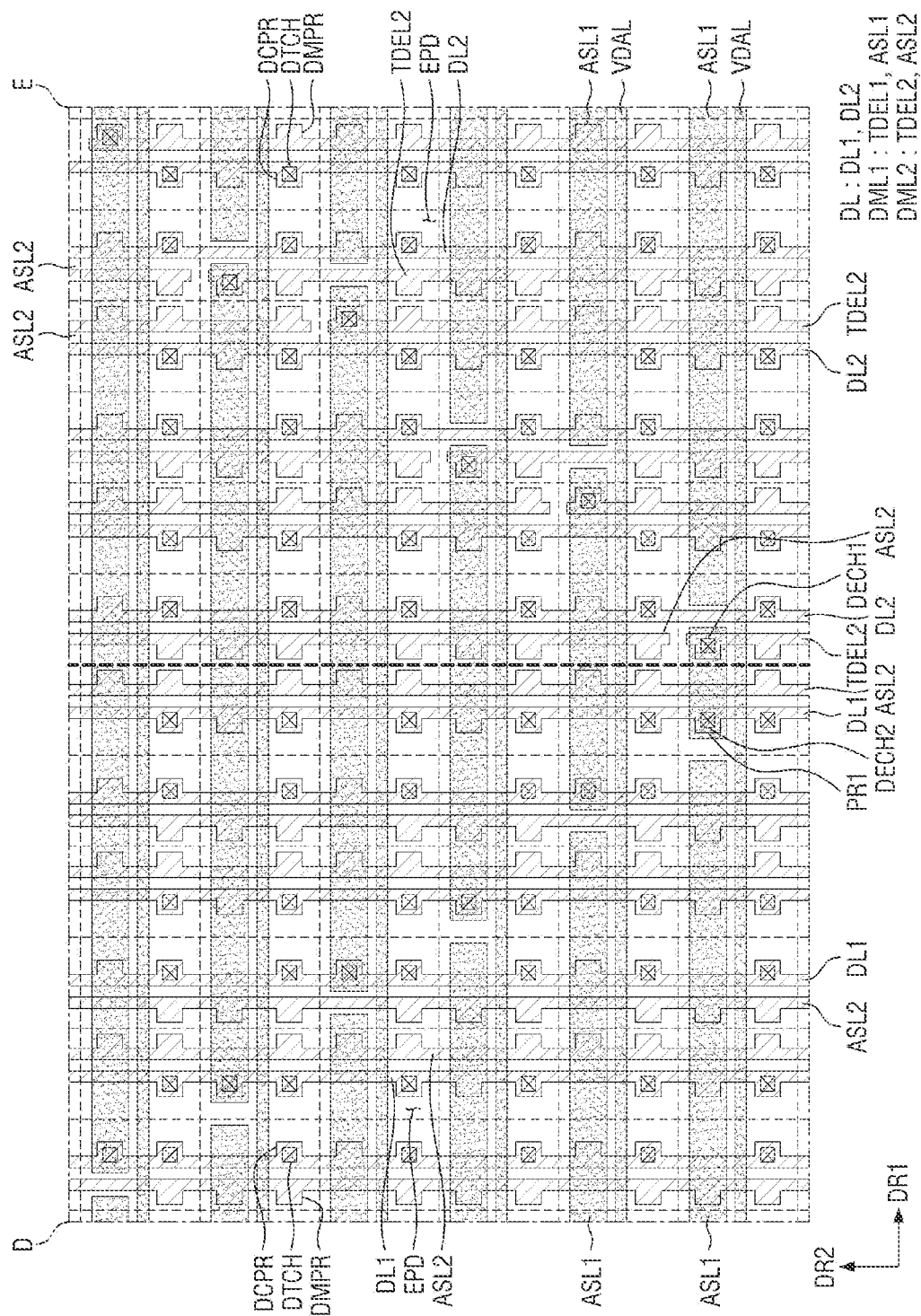
FIG. 13 is a plan view illustrating data lines, first dummy lines, and second dummy lines in enlarged views of the parts D and E of FIG. 5 according to a second embodiment.
Figure 14:
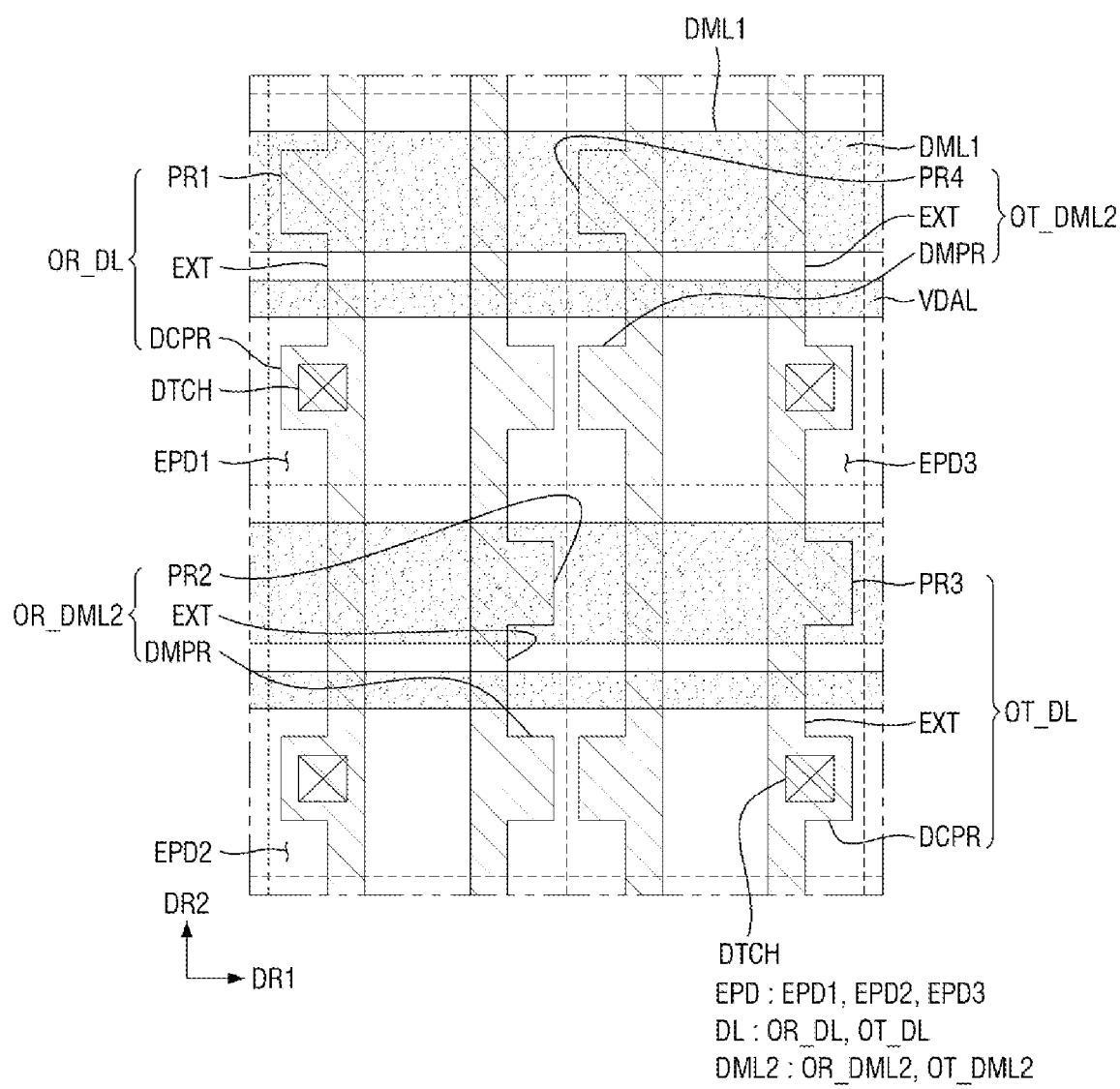
FIG. 14 is a plan view illustrating in more detail a data line and a first dummy line according to the second embodiment.

FIG. 13 is a plan view illustrating data lines, first dummy lines, and second dummy lines in enlarged views of the parts D and E of FIG. 5 according to a second embodiment. FIG. 14 is a plan view illustrating in more detail a data line and a first dummy line according to the second embodiment.

Referring to FIGS. 13 and 14, the display device 100 according to the second embodiment may be the same or substantially the same as that of the display device 100 described above with reference to FIGS. 1 to 12, except that in the second embodiment, one second dummy line OR_DML2 and another second dummy line OT_DML2 may be disposed between one data line OR_DL and another data line OT_DL, and thus, redundant description may not be repeated hereinafter.

According to the second embodiment, the extension portion EXT of one second dummy line OR_DML2 may be adjacent to the extension portion EXT of one data line OR_DL.

The extension portion EXT of another second dummy line OT_DML2 may be adjacent to the extension portion EXT of another data line OT_DL.

According to the second embodiment, the second protrusions PR2 of one second dummy line OR_DML2 may face the extension portion EXT of another second dummy line OT_DML2.

The fourth protrusions PR4 of the other second dummy line OT_DML2 may face the extension portion EXT of the one second dummy line OR_DML2.

According to the second embodiment, the first protrusions PR1 of one data line OR_DL may protrude from the extension portion EXT thereof in a direction opposite to a direction toward (e.g., facing) the one second dummy line OR_DML2.

The third protrusions PR3 of another data line OT_DL may protrude from the extension portion EXT thereof in a direction opposite to a direction toward (e.g., facing) the other second dummy line OT_DML2.

According to the second embodiment, the extension portion EXT of one second dummy line OR_DML2 is adjacent to the extension portion EXT of one data line OR_DL, and the extension portion EXT of another second dummy line OT_DML2 is adjacent to the extension portion EXT of another data line OT_DL. Accordingly, the distance between the data line DL and the second dummy line DML2 that are paired with each other may be reduced, and thus, the width of an area allocated to the arrangement of the data lines DL and the second dummy lines DML2 in the display area DA may be reduced.

Figure 15:
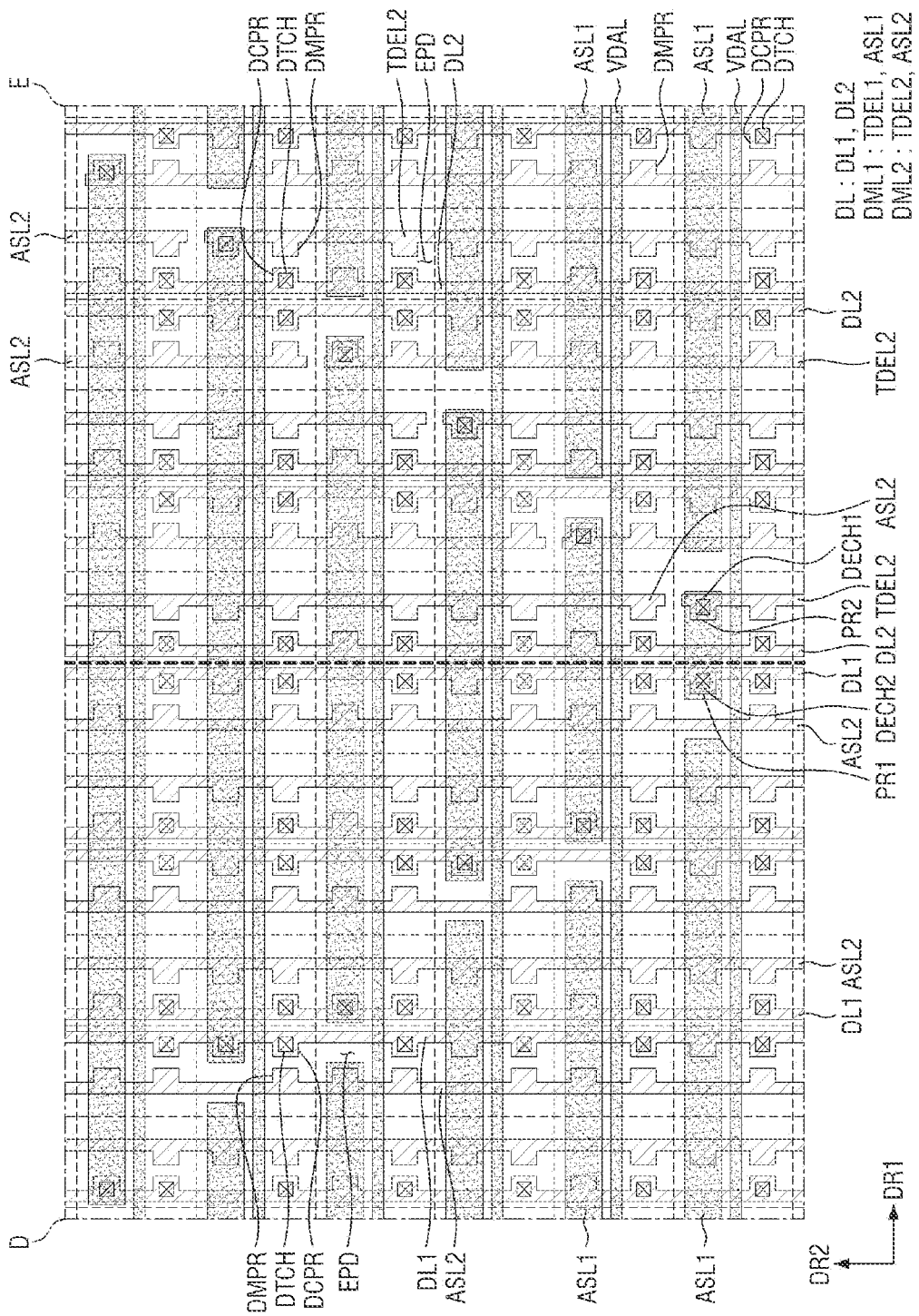
FIG. 15 is a plan view illustrating data lines, first dummy lines, and second dummy lines in enlarged views of the parts D and E of FIG. 5 according to a third embodiment.
Figure 16:
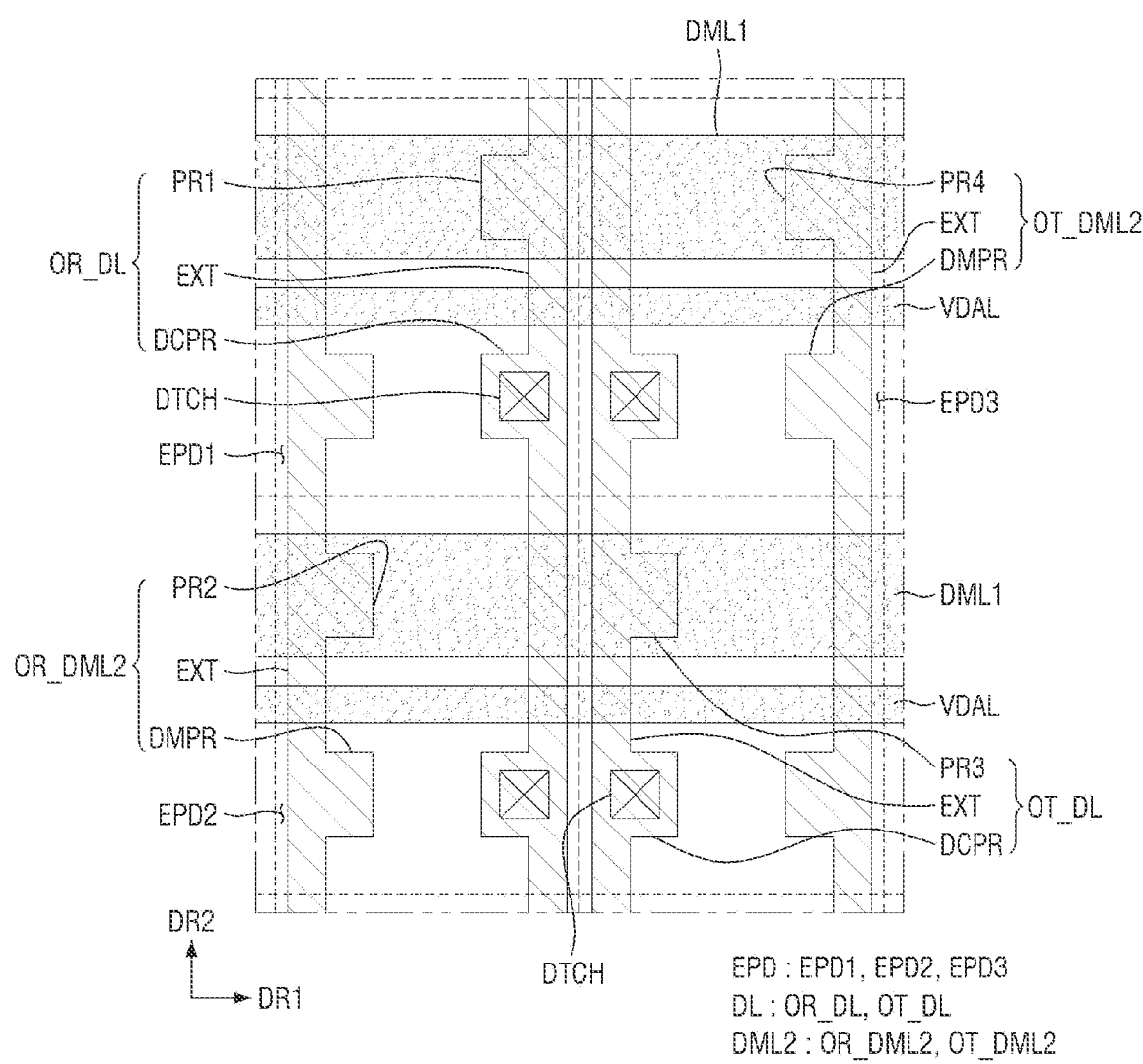
FIG. 16 is a plan view illustrating in more detail a data line and a first dummy line according to the third embodiment.

FIG. 15 is a plan view illustrating data lines, first dummy lines, and second dummy lines in enlarged views of the parts D and E of FIG. 5 according to a third embodiment. FIG. 16 is a plan view illustrating in more detail a data line and a first dummy line according to the third embodiment.

Referring to FIGS. 15 and 16, the display device 100 according to the third embodiment may be the same or substantially the same as that of the display device 100 described above with reference to FIGS. 1 to 12, except that in the third embodiment, one data line OR_DL and another data line OT_DL are disposed between one second dummy line OR_DML2 and another second dummy line OT_DML2, and thus, redundant description may not be repeated hereinafter.

According to the third embodiment, the extension portion EXT of one data line OR_DL may be adjacent to the extension portion EXT of another data line OT_DL.

According to the third embodiment, the first protrusions PR1 of one data line OR_DL and the second protrusions PR2 of one second dummy line OR_DML2 may be disposed between the extension portion EXT of the one data line OR_DL and the extension portion EXT of the one second dummy line OR_DML2.

In addition, the third protrusions PR3 of another data line OT_DL and the fourth protrusions PR4 of another second dummy line OT_DML2 may be disposed between the extension portion EXT of the other data line OT_DL and the extension portion EXT of the other second dummy line OT_DML2.

In other words, according to the third embodiment, the first protrusions PR1 of one data line OR_DL and the third protrusions PR3 of another data line OT_DL may protrude in opposite directions from each other.

Accordingly, the first protrusions PR1 of one data line OR_DL may be prevented or substantially prevented from being in contact with another data line OT_DL, so that a distance between the one data line OR_DL and the other data line OT_DL may be reduced, while preventing or substantially preventing a short-circuit failure that may occur between the one data line OR_DL and the other data line OT_DL.

Figure 17:
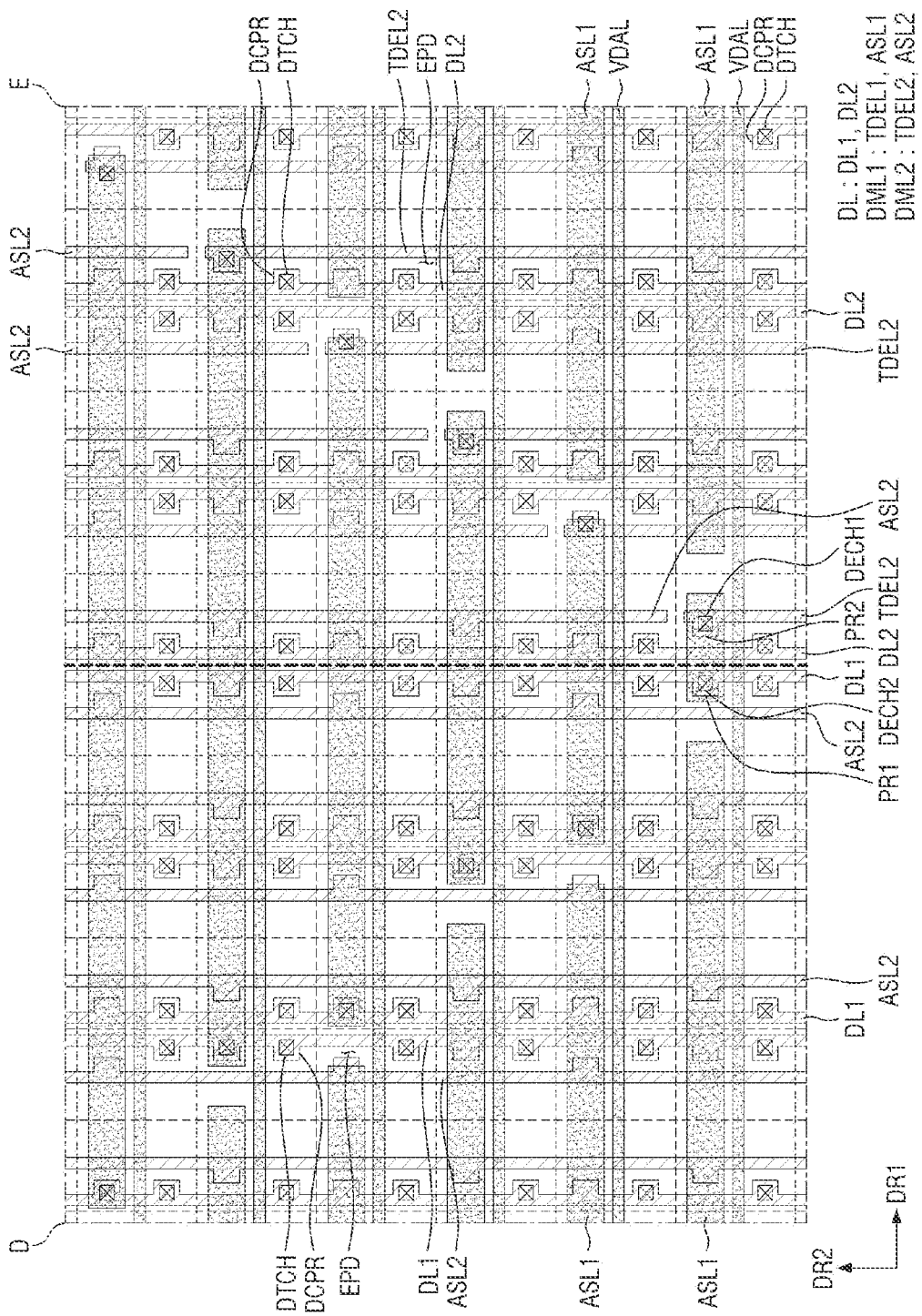
FIG. 17 is a plan view illustrating data lines, first dummy lines, and second dummy lines in enlarged views of the parts D and E of FIG. 5 according to a fourth embodiment.
Figure 18:
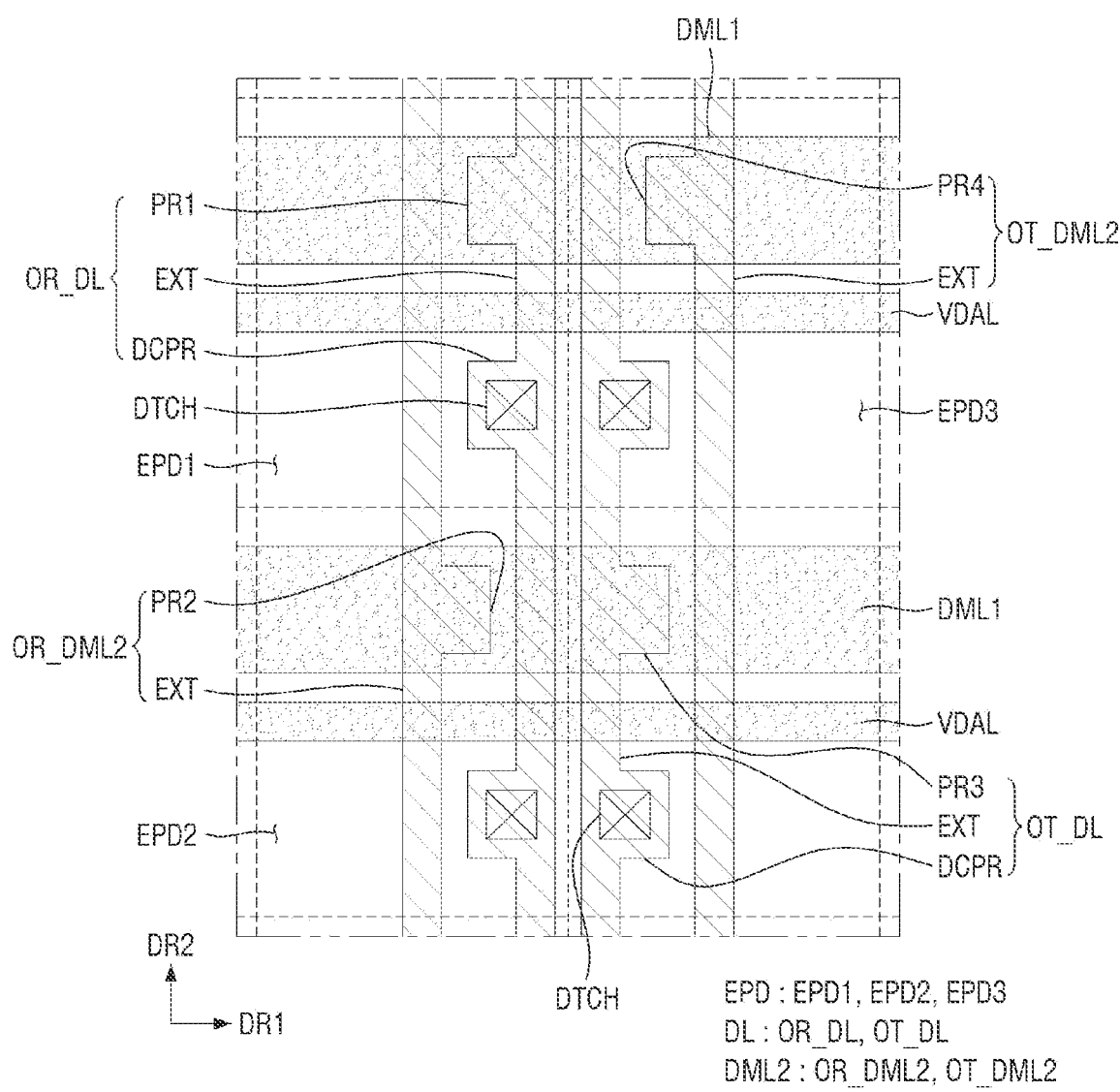
FIG. 18 is a plan view illustrating in more detail a data line and a first dummy line according to the fourth embodiment.

FIG. 17 is a plan view illustrating data lines, first dummy lines, and second dummy lines in enlarged views of the parts D and E of FIG. 5 according to a fourth embodiment. FIG. 18 is a plan view illustrating in more detail a data line and a first dummy line according to the fourth embodiment.

Referring to FIGS. 17 and 18, the display device 100 according to the fourth embodiment may be the same or substantially the same as that of the display device 100 described above with reference to FIGS. 15 and 16, except that in the fourth embodiment, the second dummy lines DML2 may not include the dummy protrusions DMPR (e.g., see FIGS. 15 and 16) facing the connection protrusions DCPR of the data lines DL, and thus, redundant description may not be repeated hereinafter.

According to the fourth embodiment, because the dummy protrusions DMPR (e.g., see FIGS. 15 and 16) facing the connection protrusions DCPR may be omitted, the connection protrusions DCPR of the data lines DL may face the extension portions EXT of the second dummy lines DML2.

As a result, because a distance between the data line DL and the second dummy line DML2 that are paired with each other may be further reduced, the width of an area allocated to the arrangement of the data lines DL and the second dummy lines DML2 in the display area DA may be further reduced.

Figure 19:
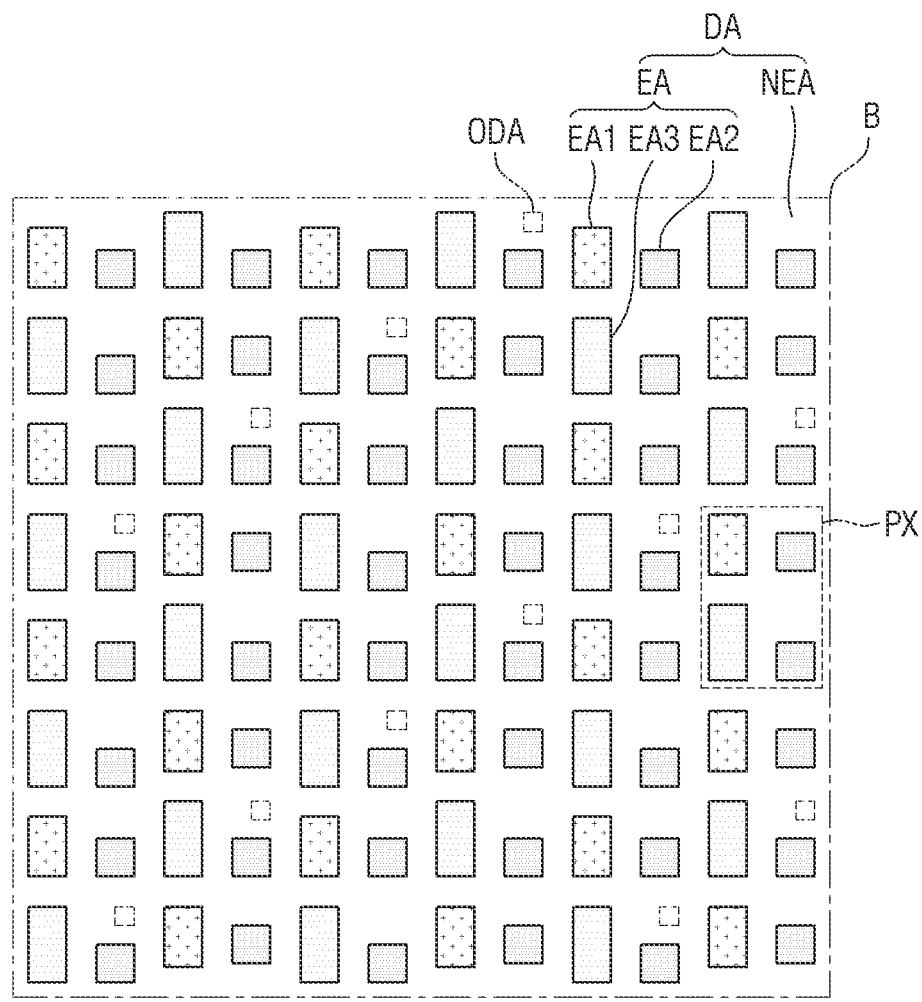
FIG. 19 is a layout diagram showing an enlarged view of the part B of FIG. 2 according to a fifth embodiment.
Figure 20:
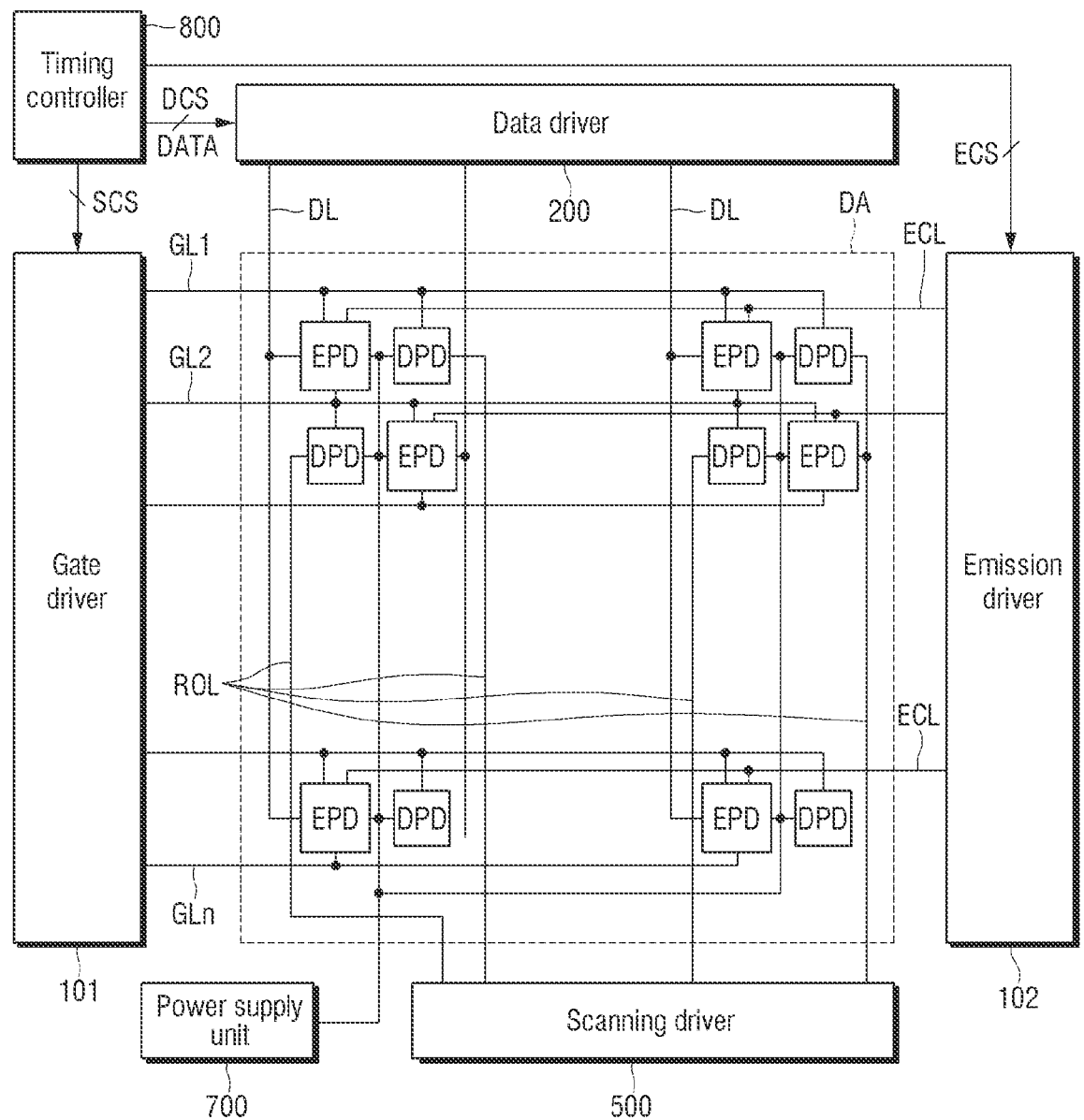
FIG. 20 is a block diagram illustrating a display device according to the fifth embodiment.
Figure 21:
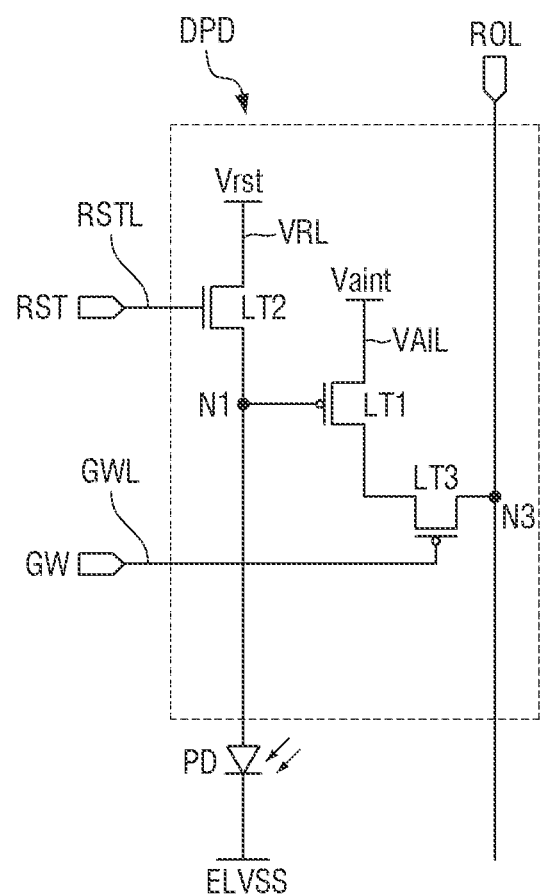
FIG. 21 is an equivalent circuit diagram illustrating a light sensing pixel driver of FIG. 20.
Figure 22:
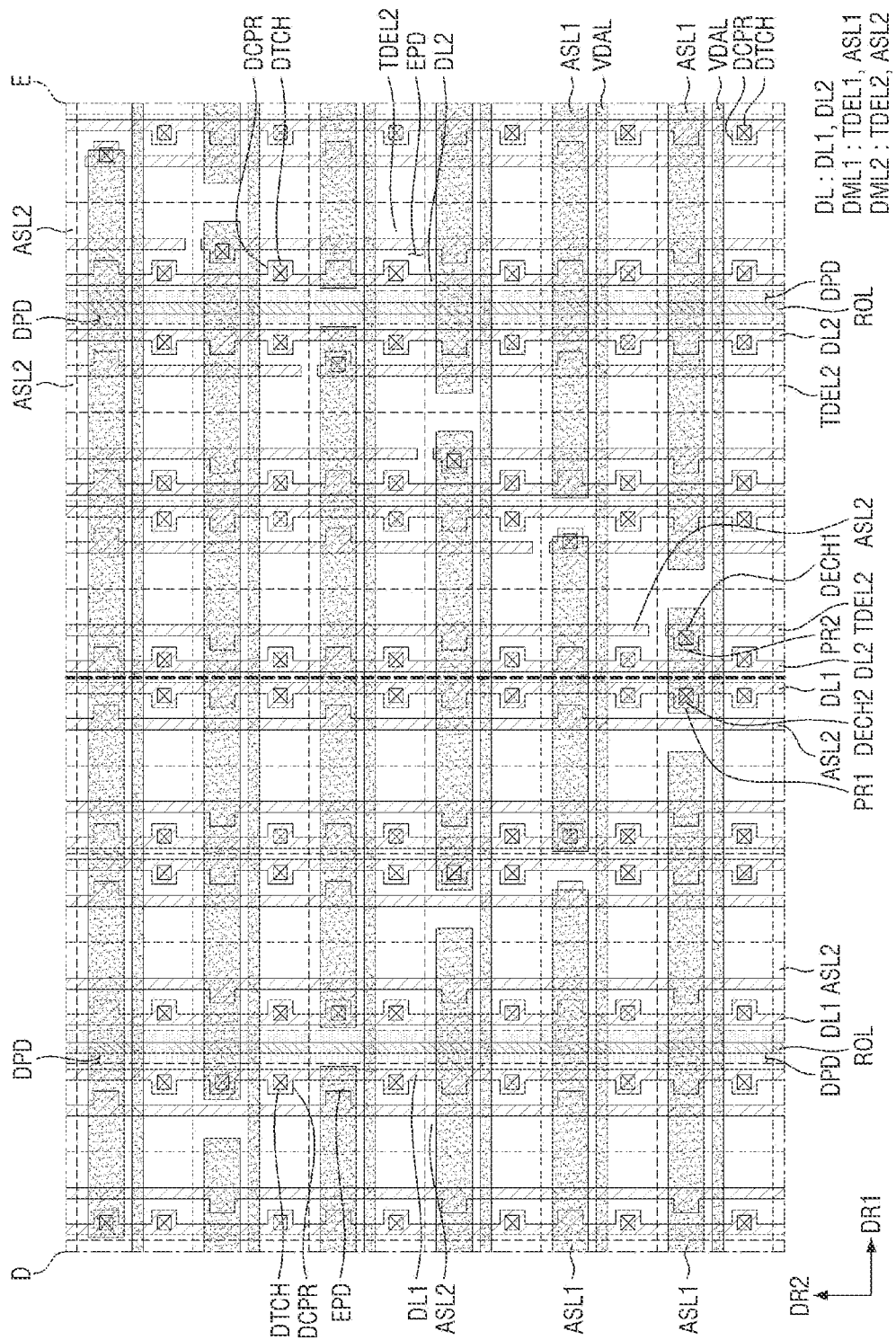
FIG. 22 is a plan view illustrating data lines, first dummy lines, and second dummy lines in enlarged views of the parts D and E of FIG. 5 according to the fifth embodiment.
Figure 23:
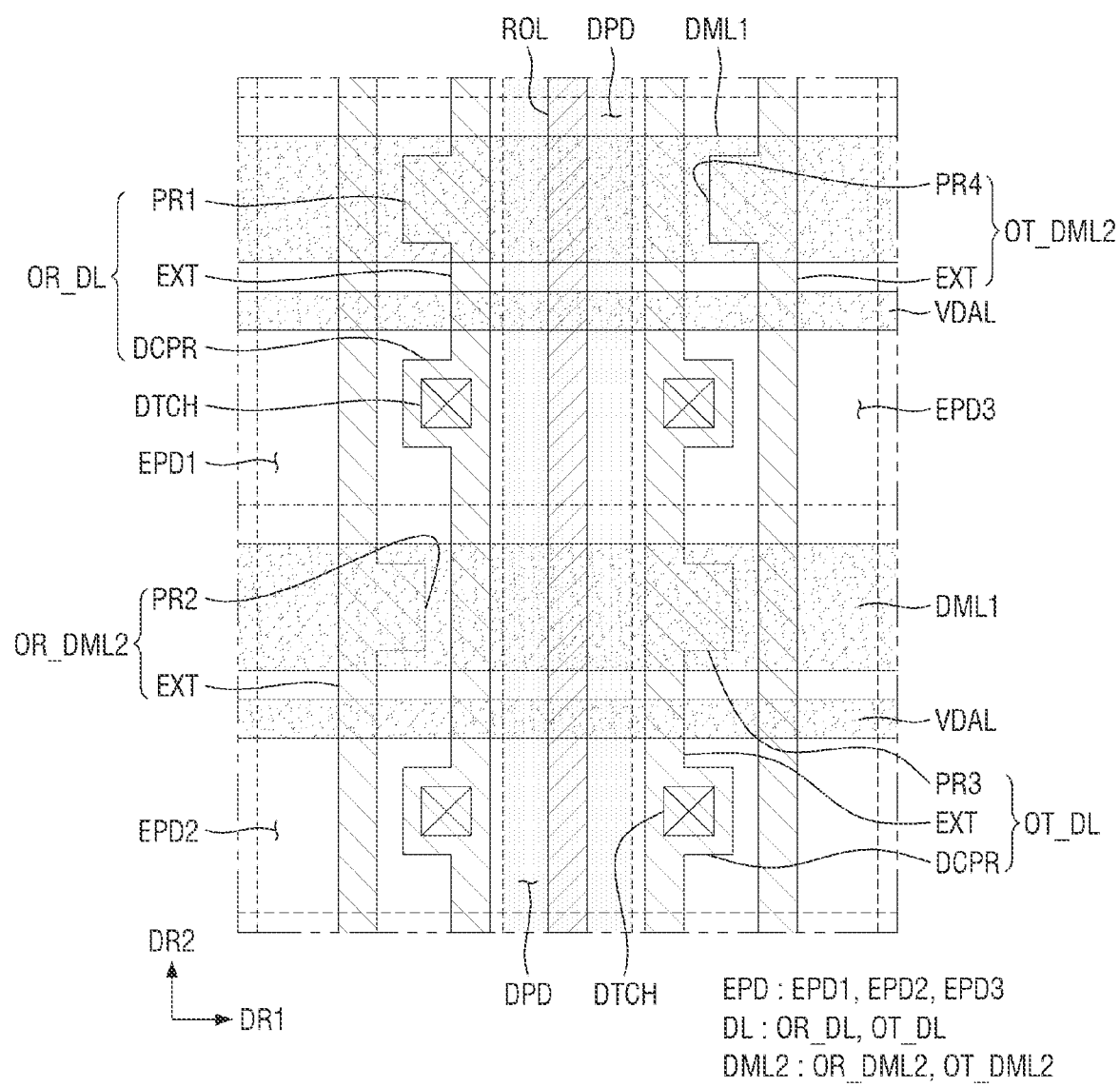
FIG. 23 is a plan view illustrating in more detail a data line and a first dummy line according to the fifth embodiment.

FIG. 19 is a layout diagram showing an enlarged view of the part B of FIG. 2 according to a fifth embodiment. FIG. 20 is a block diagram illustrating a display device according to the fifth embodiment. FIG. 21 is an equivalent circuit diagram illustrating a light sensing pixel driver of FIG. 20. FIG. 22 is a plan view illustrating data lines, first dummy lines, and second dummy lines in enlarged views of the parts D and E of FIG. 5 according to the fifth embodiment. FIG. 23 is a plan view illustrating in more detail a data line and a first dummy line according to the fifth embodiment.

According to the fifth embodiment, the display device 100 may include a scanning function for detecting a curvature of an object in contact with a screen based on differences in the amount of light reflected from the screen.

In more detail, the display device 100 may further include light sensing elements distributed in the display area DA, and a scanning driving circuit that periodically collects light sensing signals from the light sensing elements.

Referring to FIG. 19, the display area DA of the substrate 110 of the display device 100 according to the fifth embodiment may further include light sensing areas ODA disposed in parts of the non-emission area NEA.

Referring to FIG. 20, the circuit layer 120 of the display device 100 according to the fifth embodiment may include the light emitting pixel drivers EPD respectively electrically connected to the light emitting elements LE of the emission areas EA, light sensing pixel drivers DPD respectively electrically connected to light sensing elements PD (e.g., see FIG. 21) of the light sensing areas ODA, the data lines DL electrically connected to the light emitting pixel drivers EPD, and read-out lines ROL electrically connected to the light sensing pixel drivers DPD.

The display device 100 according to the fifth embodiment may include the display driving circuit (e.g., the data driver) 200 electrically connected to the data lines DL to supply the data signal Vdata, a scanning driving circuit (e.g., a scanning driver) 500 electrically connected to the light sensing pixel drivers DPD and periodically collecting the light sensing signals of the light sensing elements PD, a gate driving circuit (e.g., a gate driver) 101 electrically connected to the gate electrodes of transistors included in the light emitting pixel drivers EPD and the light sensing pixel drivers DPD, an emission control circuit (e.g., an emission driver) 102 for supplying the emission control signal EC to the light emitting pixel drivers EPD, a power supply unit (e.g., a power supply) 700 for supplying various power voltages to the light emitting pixel drivers EPD and the light sensing pixel drivers DPD, and a timing controller 800 for controlling a driving timing.

The gate driving circuit 101 and the emission control circuit 102 may be disposed in the scan driving circuit area SCDA of the non-display area NDA of the substrate 110.

The timing controller 800 receives an image signal supplied from the outside of the display device 100. The timing controller 800 may output image data DATA and a data control signal DCS to the display driving circuit 200.

In addition, the timing controller 800 may generate a scan control signal SCS for controlling the operation timing of the gate driving circuit 101, and an emission control driving signal ECS for controlling the operation timing of the emission control circuit 102. For example, the timing controller 800 may generate the scan control signal SCS and the emission control driving signal ECS, output the scan control signal SCS to the gate driving circuit 101 through a scan control line, and output the emission control driving signal ECS to the emission control circuit 102 through an emission control driving line.

The display driving circuit 200 may convert the image data DATA into analog data voltages and output the analog data voltages to the data lines DL.

The gate driving circuit 101 may generate gate signals in response to the scan control signal SCS, and sequentially output the gate signals to gate lines GL1 to GLn (n being a positive integer). Here, the gate lines GL1 to GLn may collectively refer to the scan write line GWL, the scan initialization line GIL, the gate control line GCL, the bias control line GBL, and a reset control line RSTL (e.g., see FIG. 21) electrically connected to the light sensing pixel drivers DPD.

The power supply unit 700 may supply various kinds of power used to drive the light emitting pixel drivers EPD and the light sensing pixel drivers DPD.

For example, the power supply unit 700 may supply the first power ELVDD, the second power ELVSS, the first initialization power Vint, the second initialization power Vaint, the bias power VBS, and a reset power Vrst (e.g., see FIG. 21).

The emission control circuit 102 may sequentially output the emission control signals EC to the emission control lines ECL in response to the emission control driving signal ECS. The emission control signals EC of the emission control circuit 102 may have pulses of a first level voltage or a second level voltage. However, the present disclosure is not limited thereto, and the emission control circuit 102 may not be provided separately from the gate driving circuit 101, such that it may be incorporated into the gate driving circuit 101. In this case, the gate lines GL1 to GLn may further collectively refer to the emission control lines ECL in addition to the other lines described above.

The scanning driving circuit 500 may be electrically connected to the light sensing elements PD through the read-out lines ROL and the light sensing pixel drivers DPD.

Each of the light sensing elements PD may generate a photocurrent corresponding to the amount of light incident on the light sensing element PD, and the scanning driving circuit 500 may detect the shape of a user's fingerprint based on the photocurrent of each of the light sensing elements PD.

The scanning driving circuit 500 may periodically collect the light sensing signals of the light sensing elements PD.

Based on the collected light sensing signals, the scanning driving circuit 500 may generate scanning data about the shape of an object in contact with a screen by detecting differences in the amount of light reflected by the object in contact with the screen. The scanning data may be compared with reference data on the user's fingerprint to be used to determine whether or not the user's fingerprint has been inputted.

Referring to FIG. 21, the circuit layer 120 of the display device 100 according to the fifth embodiment may further include the reset control line RSTL, a reset power line VRL, and the read-out line ROL, which are electrically connected to the light sensing pixel drivers DPD.

Each of the light sensing pixel drivers DPD may include two or more sensing transistors LT1, LT2, and LT3, and may be electrically connected between corresponding light sensing elements PD and to the scanning driving circuit 500.

Each of the light sensing pixel drivers DPD may include first to third sensing transistors LT1, LT2, and LT3.

The light sensing element PD may be a photoelectric conversion element that converts incident light into an electrical signal by generating a photocurrent corresponding to the amount of the incident light, and outputs a light sensing signal.

The light sensing element PD may be a photodiode including a sensing anode electrode, a sensing cathode electrode, and a photoelectric conversion layer disposed between the sensing anode electrode and the sensing cathode electrode.

The light sensing element PD may be a phototransistor or an inorganic photodiode formed of a PN type or PIN type inorganic material. As another example, the photoelectric conversion element PD may also be an organic photodiode including an electron donating material for generating donor ions and an electron accepting material for generating acceptor ions.

As photocharges generated in the photoelectric conversion layer move in response to incident light, a photocurrent may be generated between the sensing anode electrode and the sensing cathode electrode.

As an example, photocharges generated in the photoelectric conversion layer by light incident on the light sensing element PD may be accumulated in the sensing anode electrode. In this case, the voltage of a first node N1 electrically connected to the sensing anode electrode may increase. When the light sensing element PD and the read-out line ROL are connected to the first node N1 by the turn-on of the first and third sensing transistors LT1 and LT3, a sensing voltage may be accumulated at a third node N3 between the read-out line ROL and the third sensing transistor LT3 in proportion to the voltage at the first node N1 where charges are accumulated.

The first sensing transistor LT1 may be turned on by the voltage of the first node N1 to connect the second initialization power line VAIL to the second electrode of the third sensing transistor LT3.

The first sensing transistor LT1 may be a source follower amplifier that generates a source-drain current in proportion to the amount of electric charges of the first node N1 input to the gate electrode thereof.

The first electrode of the first sensing transistor LT1 is illustrated as being connected to the second initialization power line VAIL, but the present disclosure is not limited thereto, and the first electrode of the first sensing transistor LT1 may be connected to the first power line VDL or the first initialization power line VIL.

The second sensing transistor LT2 may be turned on by the reset control signal RST of the reset control line RSTL to connect the first node N1 to the reset voltage line VRL. Accordingly, the potential of the first node N1 may be reset.

The third sensing transistor LT3 may be turned on by the scan write signal GW of the scan write line GWL to connect the second electrode of the first sensing transistor LT1 and the read-out line ROL to each other.

At least one of the first to third sensing transistors LT1, LT2, and/or LT3 may be provided as N-type MOSFETs including a channel portion, a source portion, and a drain portion formed from the first semiconductor layer on the buffer layer 121, and a gate electrode formed from the first gate conductive layer on the first gate insulating layer 122.

At least one of the first to third sensing transistors LT1, LT2, and/or LT3 may be provided as a P-type MOSFET including a channel portion, a source portion, and a drain portion formed from the second semiconductor layer on the first interlayer insulating layer 124, and a gate electrode formed from the third gate conductive layer on the third gate insulating layer 125.

Each active layer may include any one of polysilicon, amorphous silicon, and/or an oxide semiconductor.

For example, the first sensing transistor LT1 and the third sensing transistor LT3 may be formed of a P-type MOSFET, and the second sensing transistor LT2 may be formed of an N-type MOSFET.

Referring to FIGS. 22 and 23, the display device 100 according to the fifth embodiment may be the same or substantially the same as that of the display device 100 described above with reference to FIGS. 17 and 18, except that in the fifth embodiment, the read-out lines ROL electrically connected to the light sensing pixel drivers DPD are further included, and one of the read-out lines ROL is disposed between the extension portion EXT of one data line OR_DL and the extension portion EXT of another data line OT_DL, and thus, redundant description is not repeated hereinafter.

As described above, according to various embodiments of the present disclosure, the protrusions PR1, PR2, PR3, and PR4 between the data line DL and the first dummy line DML1 and between the second dummy line DML2 and the first dummy line DML1 may not disposed at all crossing regions (e.g., intersections) between the first dummy lines DML1 and each of the data line DL and the second dummy line DML1. Because the number of protrusions is reduced, an extra width may be generated in the display area DA, which may facilitate the arrangement of the light sensing pixel drivers DPD. Accordingly, a display device 100 including the scanning function and having a high resolution may be implemented.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a substrate comprising a display area including emission areas, and a non-display area around the display area;
   a circuit layer on the substrate; and
   an element layer on the circuit layer, and comprising light emitting elements corresponding to the emission areas, respectively,
   wherein the circuit layer comprises:
      light emitting pixel drivers electrically connected to the light emitting elements, respectively, and located side by side with one another;
      data lines configured to transmit data signals to the light emitting pixel drivers;
      first dummy lines extending in a first direction crossing the data lines; and
      second dummy lines extending parallel to the data lines, and paired with the data lines, respectively,
   wherein each of the data lines and the second dummy lines comprises an extension portion extending in a second direction crossing the first direction,
   wherein one data line from among the data lines further comprises first protrusions crossing some of the first dummy lines, and
   wherein one second dummy line paired with the one data line from among the second dummy lines further comprises second protrusions crossing others of the first dummy lines except the some of the first dummy lines.

2. The display device of claim 1, wherein the light emitting pixel drivers comprise:
   a first light emitting pixel driver and a second light emitting pixel driver adjacent to each other in the second direction, and overlapping with the one data line; and
   a third light emitting pixel driver adjacent to the first light emitting pixel driver in the first direction,
   wherein the first light emitting pixel driver overlaps with one first protrusion from among the first protrusions,
   wherein the second light emitting pixel driver overlaps with one second protrusion from among the second protrusions,
   wherein another data line overlapping with the third light emitting pixel driver from among the data lines further comprises third protrusions located side by side with the second protrusions, respectively, and
   wherein another second dummy line paired with the another data line from among the second dummy lines further comprises fourth protrusions aligned with the first protrusions in the first direction, respectively.

3. The display device of claim 2, further comprising a display driving circuit configured to output the data signals to the data lines,
   wherein the circuit layer further comprises data supply lines in the non-display area, and electrically connected to the display driving circuit,
   wherein a bypass area on one side of the display area comprises:
      a bypass middle area;
      a first bypass side area parallel to the bypass middle area in the first direction, and in contact with the non-display area; and
      a second bypass side area between the bypass middle area and the first bypass side area,
   wherein the data lines comprise a first data line in the first bypass side area, and a second data line in the second bypass side area,
   wherein the first dummy lines comprise a first transmission bypass line electrically connected to the first data line,
   wherein the second dummy lines comprise a second transmission bypass line paired with the second data line, and electrically connected to the first transmission bypass line,
   wherein, from among the data supply lines, a first data supply line configured to transmit a data signal to the first data line from among the data signals is electrically connected to the first data line through the first transmission bypass line and the second transmission bypass line, and wherein, from among the data supply lines, a second data supply line configured to transmit a data signal to the second data line from among the data signals is directly electrically connected to the second data line.

4. The display device of claim 3, wherein the data lines and the second dummy lines are located on a via layer covering the first dummy lines,
wherein the first transmission bypass line is electrically connected to the second transmission bypass line through a first bypass connection hole, and electrically connected to the first data line through a second bypass connection hole, and
wherein the first bypass connection hole and the second bypass connection hole penetrate the via layer.

5. The display device of claim 3, wherein the one second dummy line is located between the one data line and the another data line, and is closer to the another data line than the one data line, and
wherein the extension portion of the one second dummy line is adjacent to the extension portion of the another data line.

6. The display device of claim 5, wherein the first protrusions face the extension portion of the one second dummy line, and
wherein the second protrusions face the extension portion of the one data line.

7. The display device of claim 3, wherein the one second dummy line and the another second dummy line are located between the one data line and the another data line,
wherein the extension portion of the one second dummy line is adjacent to the extension portion of the one data line,
wherein the extension portion of the another second dummy line is adjacent to the extension portion of the another data line,
wherein the second protrusions of the one second dummy line face the extension portion of the another second dummy line, and
wherein the fourth protrusions of the another second dummy line face the extension portion of the one second dummy line.

8. The display device of claim 7, wherein the first protrusions protrude in a direction opposite to a direction from the extension portion of the one data line toward the one second dummy line, and
wherein the third protrusions protrude in a direction opposite to a direction from the extension portion of the another data line toward the another second dummy line.

9. The display device of claim 3, wherein the one data line and the another data line are located between the one second dummy line and the another second dummy line, and
wherein the extension portion of the one data line is adjacent to the extension portion of the another data line.

10. The display device of claim 9, wherein the first protrusions and the second protrusions are located between the extension portion of the one data line and the extension portion of the one second dummy line.

11. The display device of claim 9, wherein the light emitting pixel drivers are electrically connected to the data lines through data connection holes, and
wherein the data lines further comprise connection protrusions overlapping with the data connection holes.

12. The display device of claim 11, wherein the second dummy lines further comprise dummy protrusions symmetrical to the connection protrusions.

13. The display device of claim 11, wherein the connection protrusions face the extension portions of the second dummy lines.

14. The display device of claim 9, wherein the display area further comprises a non-emission area as a separation region between the emission areas, and light sensing areas located in parts of the non-emission area,
wherein the element layer further comprises light sensing elements in the light sensing areas, respectively, and
wherein the circuit layer further comprises light sensing pixel drivers electrically connected to the light sensing elements, respectively, and read-out lines electrically connected to the light sensing pixel drivers.

15. The display device of claim 14, wherein one read-out line from among the read-out lines is located between the extension portion of the one data line and the extension portion of the another data line.

16. A display device comprising:
a substrate comprising a display area including emission areas, and a non-display area around the display area;
a circuit layer on the substrate; and
an element layer on the circuit layer, and comprising light emitting elements corresponding to the emission areas, respectively, wherein the circuit layer comprises:
light emitting pixel drivers electrically connected to the light emitting elements, respectively, and located side by side with one another;
data lines configured to transmit data signals to the light emitting pixel drivers;
first dummy lines extending in a first direction crossing the data lines; and
second dummy lines extending parallel to the data lines, and paired with the data lines, respectively,
wherein each of the data lines and the second dummy lines comprises an extension portion extending in a second direction crossing the first direction,
wherein the light emitting pixel drivers comprise a first light emitting pixel driver and a second light emitting pixel driver adjacent to each other in the second direction, and overlapping with one data line from among the data lines,
wherein the one data line overlapping with the first light emitting pixel driver and the second light emitting pixel driver further comprises first protrusions crossing some of the first dummy lines,
wherein one second dummy line paired with the one data line from among the second dummy lines further comprises second protrusions crossing others of the first dummy lines except the some of the first dummy lines,
wherein the first light emitting pixel driver overlaps with one first protrusion from among the first protrusions,
wherein the second light emitting pixel driver overlaps with one second protrusion from among the second protrusions, and
wherein the first protrusions and the second protrusions are located between the extension portion of the one data line and the extension portion of the one second dummy line.

17. The display device of claim 16, wherein the light emitting pixel drivers further comprise a third light emitting pixel driver adjacent to the first light emitting pixel driver in the first direction,
wherein another data line overlapping with the third light emitting pixel driver from among the data lines further comprises third protrusions located side by side with the second protrusions, respectively, and wherein another second dummy line paired with the another data line from among the second dummy lines further comprises fourth protrusions aligned with the first protrusions in the first direction, respectively.

18. The display device of claim 17, further comprising a display driving circuit configured to output the data signals to the data lines,
wherein the circuit layer further comprises data supply lines in the non-display area, and electrically connected to the display driving circuit,
wherein a bypass area on one side of the display area comprises:
  a bypass middle area;
  a first bypass side area parallel to the bypass middle area in the first direction, and in contact with the non-display area; and
  a second bypass side area between the bypass middle area and the first bypass side area,
wherein the data lines comprise a first data line in the first bypass side area, and a second data line in the second bypass side area,
wherein the first dummy lines comprise a first transmission bypass line electrically connected to the first data line,
wherein the second dummy lines comprise a second transmission bypass line paired with the second data line, and electrically connected to the first transmission bypass line,
wherein, from among the data supply lines, a first data supply line configured to transmit a data signal to the first data line from among the data signals is electrically connected to the first data line through the first transmission bypass line and the second transmission bypass line, and
wherein, from among the data supply lines, a second data supply line configured to transmit a data signal to the second data line from among the data signals is directly electrically connected to the second data line.

19. The display device of claim 18, wherein the one data line and the another data line are located between the one second dummy line and the another second dummy line, and
wherein the extension portion of the one data line is adjacent to the extension portion of the another data line.

20. The display device of claim 18, wherein the display area further comprises a non-emission area as a separation region between the emission areas, and light sensing areas located in parts of the non-emission area,
wherein the element layer further comprises light sensing elements in the light sensing areas, respectively,
wherein the circuit layer further comprises light sensing pixel drivers electrically connected to the light sensing elements, respectively, and read-out lines electrically connected to the light sensing pixel drivers, and
wherein one read-out line from among the read-out lines is located between the extension portion of the one data line and the extension portion of the another data line.

* * * * *